United States Patent
Kwan et al.

(10) Patent No.: US 11,238,106 B2
(45) Date of Patent: Feb. 1, 2022

(54) FINGERPRINTS FOR COMPRESSED COLUMNAR DATA SEARCH

(71) Applicant: SAP SE, Walldorf (DE)

(72) Inventors: Carmen Kwan, Toronto (CA); Reza Sherkat, Waterloo (CA)

(73) Assignee: SAP SE, Walldorf (DE)

( * ) Notice: Subject to any disclaimer, the term of this patent is extended or adjusted under 35 U.S.C. 154(b) by 236 days.

(21) Appl. No.: 16/415,572

(22) Filed: May 17, 2019

(65) Prior Publication Data
US 2020/0364269 A1 Nov. 19, 2020

(51) Int. Cl.
*G06F 7/00* (2006.01)
*G06F 16/9035* (2019.01)
*G06F 16/22* (2019.01)
*H03M 7/30* (2006.01)
*G06F 16/18* (2019.01)
*G06K 9/62* (2006.01)
*G06F 16/903* (2019.01)

(52) U.S. Cl.
CPC ...... *G06F 16/9035* (2019.01); *G06F 16/1847* (2019.01); *G06F 16/221* (2019.01); *G06F 16/90335* (2019.01); *G06K 9/6218* (2013.01); *H03M 7/3059* (2013.01)

(58) Field of Classification Search
CPC ........ G06F 16/221; G06F 16/18; G06F 16/22; G06F 16/1847; G06K 9/6218; H03M 7/3059
USPC .......................... 707/693, 758, 803, 752, 753
See application file for complete search history.

(56) References Cited

U.S. PATENT DOCUMENTS

| | | | |
|---|---|---|---|
| 10,019,457 B1* | 7/2018 | Stefani | G06F 16/1744 |
| 10,042,552 B2 | 8/2018 | Blanco et al. | |
| 10,089,342 B2 | 10/2018 | Sherkat et al. | |
| 10,140,326 B2 | 11/2018 | Sherkat et al. | |
| 2017/0322960 A1 | 11/2017 | Glebe et al. | |
| 2017/0364554 A1 | 12/2017 | Nica et al. | |
| 2017/0371909 A1 | 12/2017 | Andrei et al. | |

(Continued)

OTHER PUBLICATIONS

Alexiou et al., "Adaptive Range Filters for Cold Data: Avoiding Trips to Siberia," Proceedings of the VLDB Endowment, vol. 6, No. 14, Sep. 2013, 12 pages.

(Continued)

*Primary Examiner* — Md I Uddin
(74) *Attorney, Agent, or Firm* — Fish & Richardson P.C.

(57) ABSTRACT

The present disclosure involves systems, software, and computer implemented methods for compressed columnar data search using fingerprints. One example method includes compressing columnar data that includes dividing the columnar data into multiple data blocks and generating a fingerprint for each data block, storing the compressed columnar data and the generated fingerprints in an in-memory database, receiving a query for the columnar data, for each in-memory data block stored in the in-memory database, determining whether the in-memory data block satisfies the query and in response to a determination that the in-memory data block does not satisfy the query, pruning the in-memory data block from the multiple data blocks to generate an unpruned set of data blocks, decompressing the unpruned set of data blocks, and performing a query search on the decompressed unpruned set of data blocks for the received query.

17 Claims, 5 Drawing Sheets

(56) References Cited

U.S. PATENT DOCUMENTS

2018/0329973 A1 1/2018 Sherkat et al.
2018/0329974 A1 11/2018 Bensberg et al.
2020/0351347 A1* 11/2020 Chang .................. G06F 16/156

OTHER PUBLICATIONS

Antoshenkov, "Byte-Aligned Bitmap Compression," Proceedings DCC'95 Data Compression Conference. IEEE, Mar. 1995, 1 page.
Bloom, "Space/Time Trade-offs in Hash Coding with Allowable Errors," Communications of the ACM, vol. 13, No. 7, Jul. 1970, 5 pages.
Chambi et al., "Better Bitmap Performance with Roaring Bitmaps," arXiv:1402.6407v10, Mar. 15, 2016, 11 pages.
Chan et al., "An Efficient Bitmap Encoding Scheme for Selection Queries," ACM SIGMOD Record, vol. 28, No. 2, Jun. 1999, 12 pages.
Chan et al., "Bitmap Index Design and Evaluation," ACM SIGMOD Record, vol. 27, No. 2, Jun. 1998, 12 pages.
Chen et al., "Global Range Encoding for Efficient Partition Elimination," EDBT, 2018, 4 pages.
Colantonio et al., "Concise: Compressed 'n' composable integer set," Information Processing Letters, vol. 110, No. 16, Jul. 2010, 7 pages.
Curino et al., "Schism: A Workload-Driven Approach to Database Replication and Partitioning," Proceedings of the VLDB Endowment, vol. 3, No. 1-2, Sep. 2010, 10 pages.
Hentschel et al., "col. Sketches: A Scan Accelerator for Rapid and Robust Predicate Evaluation," Proceedings of the 2018 International Conference on Management of Data, ACM, May 2018, 16 pages.
Koudas, "Space Efficient Bitmap Indexing," CIKM, Nov. 2000, 8 pages.
Lemke et al., "Speeding Up Queries in Column Stores," International Conference on Data Warehousing and Knowledge Discovery: Data Warehousing and Knowledge Discovery, Aug. 2010, 14 pages.
Li, "BitWeaving: Fast Scans for Main Memory Data Processing," Proceedings of the 2013 ACM SIGMOD International Conference on Management of Data. ACM, Jun. 2013, 15 pages.
Moerkotte, "Small Materialized Aggregates: A Light Weight Index Structure for Data Warehousing," VLDB '98 Proceedings of the 24rd International Conference on Very Large Data Bases, Aug. 1998, 12 pages.
Nica et al., "Statisticum: Data Statistics Management in SAP HANA," Proceedings of the VLDB Endowment, vol. 10, No. 12, Aug. 2017, 12 pages.
O'Neil et al., "Improved Query Performance with Variant Indexes," ACM Sigmod Record, vol. 26, No. 2, Jun. 1997, 26 pages.
Plattner, "The Impact of Columnar In-Memory Databases Enterprise Systems," Proceedings of the VLDB Endowment, vol. 7, No. 13, Aug. 2014, 8 pages.
Qin, "Adaptive Data Skipping in Main-Memory Systems," Proceedings of the 2016 International Conference on Management of Data. ACM, Jun. 2016, 2 pages.
Sidirourgos et al., "Column Imprints: A Secondary Index Structure," Proceedings of the 2013 ACM SIGMOD International Conference on Management of Data. ACM, Jun. 2013, 12 pages.
Sinha et al., "Multi-Resolution Bitmap Indexes for Scientific Data," ACM Transactions on Database Systems (TODS), vol. 32, No. 3, Aug. 2007, 38 pages.
Sun et al., "Fine-Grained Partitioning for Aggressive Data Skipping," Proceedings of the 2014 ACM SIGMOD international conference on Management of data, ACM, Jun. 2014, 12 pages.
Sun et al., "Skipping-Oriented Partitioning for Columnar Layouts," Proceedings of the VLDB Endowment, vol. 10, No. 4, Nov. 2016, 12 pages.
TPC.org [online], "TPC-H: TPC-H is a Decision Support Benchmark," TPC-H, [retrieved on Apr. 24, 2019], retrieved from: URL< http://www.tpc.org/tpch/>, 1 page.
Wu et al., "Optimizing Bitmap Indices with Efficient Compression," ACM Transactions on Database Systems (TODS), vol. 31, No. 1, Mar. 2006, 36 pages.
Wu et al., "Range-Based Bitmap Indexing for High Cardinality Attributes with Skew," Proceedings of The Twenty-Second Annual International Computer Software and Applications Conference (Compsac'98), Cat. No. 98CB 36241, IEEE, Aug. 1998, 6 pages.

* cited by examiner

FINGERPRINTS FOR COMPRESSED COLUMNAR DATA SEARCH

TECHNICAL FIELD

The present disclosure relates to systems, software, and computer-implemented methods for compressed columnar data search using fingerprints in, for example, an in-memory columnar database.

As the amount of data requested by data-intensive applications increases, the amount of data managed by in-memory databases increases. To improve performance, data compression techniques can be used to keep large amount of data in-memory, instead of loading large amount of data on demand from, for example, a disk storage. However, high data compression ratio comes with both memory and performance overhead for data queries. For example, before applying a scan algorithm to answer a data query, compressed data is decompressed into vectors using hardware vectorization and parallelization.

SUMMARY

The present disclosure describes methods and systems, including computer-implemented methods, computer program products, and computer systems for compressed columnar data search using fingerprints in an in-memory database (e.g., an in-memory columnar database). One example computer-implemented method includes compressing columnar data to be stored in an in-memory database, where compressing columnar data includes dividing the columnar data into multiple data blocks and generating a particular fingerprint for each particular data block in the multiple data blocks, storing the compressed columnar data and the generated fingerprints in the in-memory database, receiving a query for the columnar data, for each particular in-memory data block in the multiple data blocks stored in the in-memory database, determining whether the particular in-memory data block satisfies the query and in response to a determination that the particular in-memory data block does not satisfy the query, pruning the particular in-memory data block from the multiple data blocks to generate an unpruned set of data blocks, decompressing the unpruned set of data blocks, and performing a query search on the decompressed unpruned set of data blocks for the received query.

The above-described implementation is implementable using a computer-implemented method; a non-transitory, computer-readable medium storing computer-readable instructions to perform the computer-implemented method; and a computer system comprising a computer memory interoperably coupled with a hardware processor configured to perform the computer-implemented method/the instructions being stored on the non-transitory, computer-readable medium.

As the amount of data requested by data-intensive applications increases, the amount of data managed by in-memory databases increases. To improve performance, data compression techniques can be used to keep large amount of data in-memory, instead of loading large amount of data on demand from, for example, a disk storage. However, high data compression ratio comes with both memory and performance overhead for data queries. For example, before applying a scan algorithm to answer a data query, compressed data is decompressed into vectors using, for example, hardware vectorization and parallelization. Decompressing the whole compressed data each time a data query for the whole compressed data is received can consume, for example, extra CPU and memory resource.

In this specification, data summaries of fine granularity at column block level are introduced to alleviate the memory and/or performance overhead in data queries for compressed data. Complementary to partition pruning, summaries of fine granularity at column block level can be designed based on data distribution in column blocks to support block pruning. Experimental results show that under same memory budget used for partition pruning, block pruning can lower false positive rates for compressed data scans, and reduce overhead of implementing data compression schemes.

The subject matter described in this specification can be implemented in particular implementations so as to realize one or more of the following advantages. First, the systems and/or methods described in the present disclosure introduces new fingerprints used to facilitate compressed columnar data search in an in-memory columnar database. The new fingerprints are orthogonal to the compression scheme (e.g., independent of a compression technique employed). Second, the systems and/or methods described in the present disclosure can perform quick compressed columnar data search using block pruning based on the fingerprints. Instead of decompressing all blocks of compressed columnar data, some blocks can be pruned and not decompressed (e.g., not searched) based on the fingerprints. As a result, decompressing portions of the compressed data for the search can reduce data decompression overhead. Third, different fingerprint schemes can be used based on data distribution in the columnar data to further decrease false positive rates and/or reduce data decompression overhead. Other advantages will be apparent to those of ordinary skill in the art.

The details of one or more implementations of the subject matter of this specification are set forth in the accompanying drawings and the description below. Other features, aspects, and advantages of the subject matter will become apparent from the description, the drawings, and the claims.

DETAILED DESCRIPTION

The following detailed description describes compressed columnar data search using fingerprints in, for example, an in-memory columnar database. Various modifications to the disclosed implementations will be readily apparent to those skilled in the art, and the general principles defined herein may be applied to other implementations and applications without departing from scope of the disclosure. Thus, the present disclosure is not intended to be limited to the described or illustrated implementations, but is to be accorded the widest scope consistent with the principles and features disclosed herein.

To take advantage of precious main memory, in-memory columnar databases can use compression techniques (e.g., sparse and cluster encoding) to complement memory saving achieved by, for example, dictionary encoding and uniform bit packing. While data compression reduces memory overhead of columnar data, applying scan operators (e.g., Bit-Weaving) on compressed data may require decompressing data into vector format first. As a result, extra CPU and memory resource may be consumed on data decompression. The decompression overhead can be mitigated using pruning techniques (e.g., maintaining metadata for each table partition as implemented in commercial databases (e.g., SAP HANA) to skip column partitions having no value satisfying a query predicate).

Different from partition metadata, this specification introduces column block level pruning to improve compressed columnar data search. For example, a column block metadata is gap-sensitive and space-efficient, with a construction time linear to the corresponding column block size. Fingerprint Header (FH), a family of localized data synopsis, is introduced in this specification, and can be used as column block metadata, which not only maintains approximate range of each column block but also keeps information about data gaps in each column block. Using FH, probing for range and/or point queries takes constant time, and reduces average false positive rate for unsorted data comparing to using partition metadata. Six example fingerprint schemes are proposed for block headers in this specification. For example, each fingerprint scheme can be used for a particular data distribution in a column block.

Figure 1:
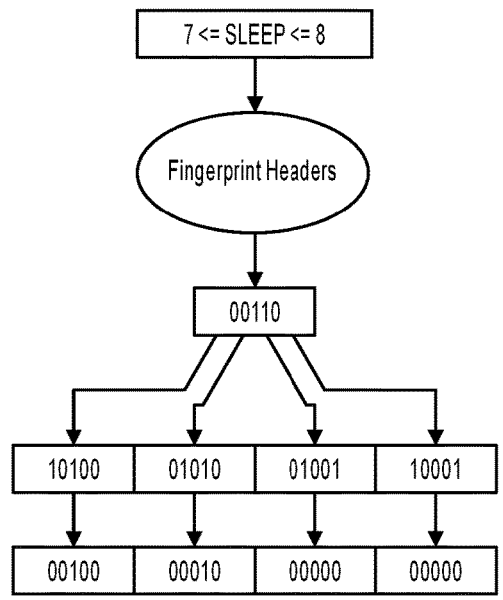
FIG. 1 illustrates an example of block pruning in compressed columnar data search using fingerprints, according to an implementation.

Turning to the illustrated embodiment, FIG. 1 illustrates an example 100 of block pruning in compressed columnar data search using fingerprints, according to an implementation. Specifically, the example 100 includes an uncompressed data table 102, a sleep column dictionary 104, a cluster encoding of sleep column ValueId 106, blocks and fingerprint encoding 108, and block pruning 110.

As illustrated in FIG. 1, the sleep column in the uncompressed data table 102 is to be compressed. As shown in the cluster encoding of sleep column ValueId 106, the sleep column in the uncompressed data table 102 is compressed successively using dictionary compression, cluster encoding with a cluster size of four, and uniform bit packing. The sleep column dictionary 104 stores a sorted dictionary of every unique column value of the sleep column in the uncompressed data table 102. Each column value of the sleep column in the uncompressed data table 102 is encoded as a corresponding value identifier (ValueId) according to the sleep column dictionary 104. Cluster encoding compresses fixed size clusters (e.g., groups of consecutive values) where all values in a cluster are the same by encoding a single instance of ValueId in the cluster, and setting a corresponding bit to 1 in a bit vector. Otherwise, a corresponding bit is set to 0 in the bit vector as shown in the cluster encoding of sleep column ValueId 106. To apply uniform bit packing, each ValueId is encoded using a minimal number of bits, and the encoding is stored compactly by shuffling multiple encodings into a single word.

Before creating a Fingerprint Header (FH), the sleep column is grouped virtually into fix-size blocks. For example, if there are f bits in a fingerprint, a range of value identifiers can be represented as f intervals in the corresponding fingerprint. If every value of a column block is within a defined range, the fingerprint can be created by setting all sub-interval bits containing values from the column block to 1. To create a fingerprint using five bits for the full dictionary range of [0, 4] for every block of five ValueIds, the block encodings in the order appearing in the column will be 10100, 01010, 01001, and 10001 as shown in the blocks and fingerprint encoding 108.

As shown in the block pruning 110, to query the entire data table with a predicate of {7≤Sleep≤8}, the predicate is first evaluated on the sleep column dictionary 104. An equivalent predicate is identified to retrieve a set of ValueIds that answers the query. Since the original predicate is a range query, the equivalent predicate is also a range predicate (i.e., {2≤ValueId≤3}). To process this query without data synopsis, all data will need to be unpacked and decompressed, so that each ValueId in the uncompressed data table 102 can be vectorized for predicate evaluation. If a ValueId satisfies the predicate, the corresponding row position is added to a query result set. However, with block data synopsis described in this specification, the equivalent predicate is first check to determine whether the equivalent predicate is disjoint with each block data. For example, since the predicate is encoded the same way as a block, a bitwise AND operation can be used for the predicate encoding with each block fingerprint encoding. For a particular block, if a bit vector obtained after the bitwise AND operation has no bit set to 1 (e.g., 00000 in the block pruning 110), values in the particular block do not need to be examined for the query. In other words, the particular block can be skipped (or pruned) and do not need to be decompressed. As shown in the block pruning 110, after block pruning, only the first and second blocks are decompressed and examined for the query, while the third and fourth blocks are pruned. In doing so, the expense of decompressing the third and fourth blocks is eliminated, thereby reducing data decompression overhead for the query.

Figure 2:
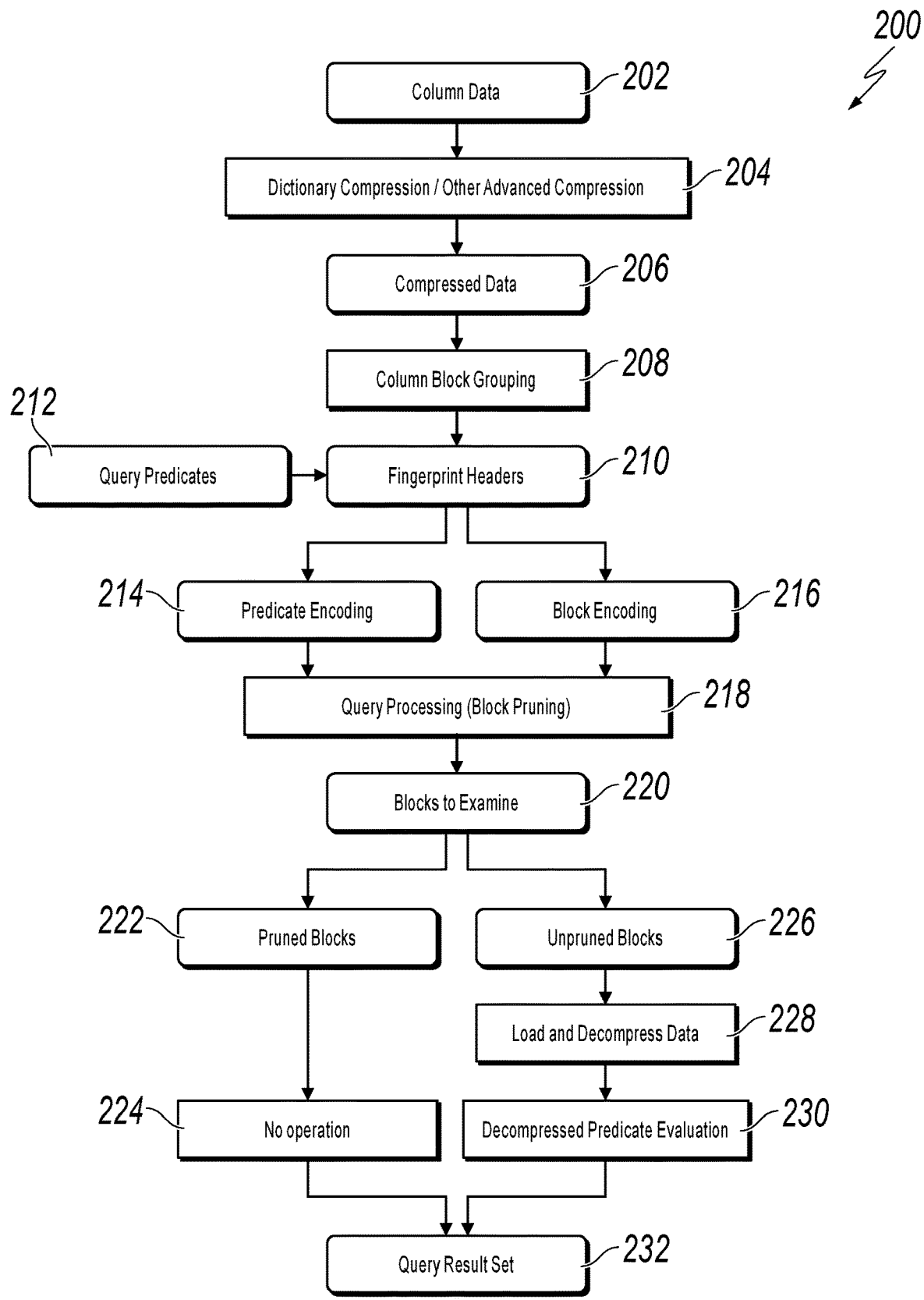
FIG. 2 illustrates an example flow of compressed columnar data search using fingerprints, according to an implementation.

FIG. 2 illustrates an example flow 200 of compressed columnar data search using fingerprints, according to an implementation. It will be understood that flow 200 and related flows may be performed, for example, by any suitable system, environment, software, and hardware, or a combination of systems, environments, software, and hardware, as appropriate.

Table 1 provides a summary of notations used in this specification.

TABLE 1

| Symbol | Meaning |
| --- | --- |
| N | The number of rows in a column |
| ValueId | An integer value identifier, a key from column value dictionary |
| D | The column dictionary size |
| b | The number of bits needed to represent each ValueId in the dictionary |
| B | The number of ValueIds in a block |
| $l_{min}$ | A block's local minimum |
| $l_{max}$ | A block's local maximum |
| h | A column block's header size (in bits) |
| f | The number of fingerprint bits in a header |
| $p_{mem}$ | The percentage of a column size allocated to block headers |
| $p_{sel}$ | The percentage of D selected in a query |

A column block refers to a group of contiguous values in the column. Blocks do not have direct correspondence with the physical layout of the corresponding column. Blocks provide a finer granularity for skipping data than partitions, since a block contains less values than a partition.

A gap refers to an absent value range within a defined domain range. For example, [7, 9] is a gap in a domain range of [0, 10], if 7, 8, and 9 are not in the block. The domain range of [0, 10] has a local minimum of 0 and a local maximum of 10. In dictionary compression, a gap implicitly refers to missing value(s) in a column value identifier range.

A bin refers to a range of values represented by a single bit. Bin size refers to a range length.

A fingerprint domain is an integer range used when encoding a specific fingerprint.

In this specification, one or more of the following assumptions are made. For example, Fingerprint Headers can only be created if all values within a block is confined to a well-ordered integer domain. Pruning algorithms consider the order between value identifiers during predicate evaluation to be present. Otherwise, pruning can incur false negative.

Since block pruning is complementary to partition pruning, there are opportunities to skip (or prune) data at a finer level than at a partition level. For example, looking at a block level can lead to more representable gaps for pruning than at a partition level.

Fingerprint Headers are used in contexts where the dictionary size is large enough to justify block-level pruning. For example, if a column has only one specific value, there is no gap in any block, and no pruning algorithm can be used to improve performance. In such cases, any range-based synopsis created will most likely show the entire range, and there is not opportunity for block pruning.

Different fingerprint schemes are provided to represent different targeted data distribution. Apart from Basic Fingerprint (BS), all other fingerprint schemes adjust and encode extra parameter information to a fingerprint for each data block the fingerprint represents to provide accurate data representation. For example, if all data blocks have the same data distribution, the extra parameter information can be encoded just once globally. However, in some implementations, encoding on a per block basis can perform better than encoding just once globally.

In some implementations, the techniques described in this specification is for compressed blocks (e.g., column-wide or block-wide) to take advantage of opportunities to reduce data decompression overhead and/or memory footprint.

As illustrated in FIG. 2, the example flow 200 includes generating fingerprints for compressed columnar data (e.g., 202-210) and compressed column data search using fingerprints (e.g., 214-232) based on query predicates (e.g., 212). The example flow 200 shown in FIG. 2 can be modified or reconfigured to include additional, fewer, or different actions (not shown in FIG. 2), which can be performed in the order shown or in a different order. In some implementations, one or more of the actions shown in FIG. 2 can be repeated or iterated, for example, until a terminating condition is reached. In some implementations, one or more of the individual actions shown in FIG. 2 can be executed as multiple separate actions, or one or more subsets of the actions shown in FIG. 2 can be combined and executed as a single action. In some implementations, one or more of the individual actions shown in FIG. 2 may also be omitted from the example flow 200.

At 202 column data is received for compression. For example, the column data is compressed to be stored in an in-memory columnar database. At 204, dictionary compression or any other appropriate advanced compression is applied to the column data to generate compressed data (206).

At 208, the column data is grouped into blocks. Fixed block size (e.g., 5) can be used for simple implementation. In some implementations, using variable block size can have better results than using fixed block size. For example, fixed block size can be calculated as $$B = \left\lceil \frac{h}{p_{mem} \times b} \right\rceil.$$

In the example 100 in FIG. 1, b=3 and h=5. $p_{mem}$=33% is chosen so that the block size is 5. In the example flow 200, data is not physically organized into blocks. Physically organizing data into blocks may require storing the value of B and the number of values per block.

At 210, a fingerprint scheme is selected to generate a Fingerprint Header for each column block based on, for example, a dictionary size and one or more heuristics (described below). For example, after the column data has been compressed and grouped, a fingerprint scheme can be chosen to encode the Fingerprint Header(s). Six example fingerprint schemes are presented in this specification (described below).

After Fingerprint Headers are generated, data search using fingerprints can be performed on the compressed data. For example, at 212, a query for the compressed date is received. In some implementations, the query can include one or more query predicates. At 214, the query predicates can be encoded by referencing the fingerprint scheme selected at 210. Similarly, at 216, each block can be encoded based on the selected fingerprint scheme chosen and the dictionary size.

At 218, the query is processed. At 220, blocks to examine are determined. For example, each block encoding is compared with the predicates encoding using bitwise AND operation. Based on a result of the bitwise AND operation, a determination is made as to whether the particular block can be pruned. If it is determined that the particular block can be pruned, the particular block is pruned at 222. At 224, no operation (e.g., decompressing operation) is performed on the particular block. Otherwise, if it is determined that the particular block cannot be pruned, the particular block is determined to be an unpruned block at 226. At 228, compressed data in the particular block is decompressed. At 230, predicate evaluation is performed on the decompressed data. At 232, a query result set is generated for the query.

Since a limited number of bits can be used for block synopsis, accurate representation by the block synopsis is desired. The different example schemes presented in this specification can, for example, minimize fingerprint bin size to achieve low false positive rate. Table 2 illustrates visual representation on how each fingerprint scheme utilizes its allocated space.

TABLE 2

| BF  |               | fingerprint   |                          |
|-----|---------------|---------------|--------------------------|
| UF  | ind           | r             | fingerprint              |
| SF  | ind           | s             | fingerprint              |
| IF  | fingerprint$^1$ |             | fingerprint$^2$          |
| TLF | fingerprint$^1$ | fingerprint$_0^2$ ... fingerprint$_{k-1}^2$ | |
| HF  | t             | fingerprint ∈ {BF, SF, IF,TLF} | |

Basic Fingerprint (BF) is the basic fingerprint that uses all bits in the header to represent the entire [0,D−1] range. This representation is similar to the classic Global Range Encoding (GRE), without the Global Range Table (GRT). For example, BF supports reuse of the same fingerprint representation for each query used in all blocks during predicate evaluation.

Unilateral Fingerprint (UF) considers the distribution of values in a column block. For example, if there are gaps close to ValueId=0 or ValueId equal to dictionary size, interval gap at one range extremity can first be excluded by storing a range radius $$r = \left\lfloor \frac{\min(D - l_{min} - 1, l_{max})}{2} \right\rfloor$$

before the fingerprint creation. The layout has $\lceil \log_2 D \rceil - 1$ bits for r, and dedicates an indicator bit to represent whether r is measured from the beginning (i.e., starting from zero) or the middle section of value range (i.e., ending at D−1 range). Unlike BF, UF does not need to store unset bits in the extreme range of the column block. The size of UF grows logarithmically with the dictionary size. As a result, UF does not perform well for large dictionary size.

Selective Fingerprint (SF) trades the approximation accuracy of range boundary by providing a finer representation. For example, SF allocates more fingerprint bits instead of using more bits to represent the range. The interval [0,D−1] is first virtually split into p partitions, where p≥2 is a power of two. Then, a selector s is stored, where 0≤s<p, to represent a partition number. Furthermore, an indicator bit is stored to represent whether the partition contains $l_{min}$ or $l_{max}$, to encode the selected partition's lower bound or upper bound as one of the range boundaries. In some implementations, SF uses a value of p less than $2^b$ to avoid using more bits than necessary to encode s.

Two-Level Fingerprint (TLF) represents intervals in two sections: the first section is a coarse representation (e.g., as in BF) and the second section is a refined representation of dense intervals. For example, the fingerprint in the first section is fingerprint$^1$ and its fingerprint size is $f_1$. fingerprint$_i^2$ is the notation for the i-th fingerprint in the second section and $f_2$ is the number of bits in the second section. For each bit set to one in fingerprint$^1$, corresponding bits are allocated in the second section to represent the corresponding value range using a finer granularity fingerprint. Unset bits in the first section correspond to gaps in the second section, and are not represented in the second section. For example, if k denotes the number of bits set to one in fingerprint$^1$, $2k \leq f_2$. Creating and searching TLF can be time consuming because of iterative creation of the finer fingerprints in the second section, which is done on a per block basis.

Impartial Fingerprint (IF) infers the sub-intervals that contains $l_{min}$ and $l_{max}$ from the first section, and encodes the second section using a deduced boundaries. In some implementations, if there are not many fingerprints in the second section, the single fingerprint in the second section can be denoted as fingerprint$^2$ for IF.

The pruning power of a fingerprint scheme depends on, for example, column block identifier distribution. In some implementations, a fingerprint scheme can be optimized for a target block distribution. To take advantage of each fingerprint scheme described above, Heterogeneous Fingerprint (HF) encodes most representative fingerprint scheme per column block. For example, HF uses two extra bits to encode t, a number in the range [0, 3] to indicate which type of fingerprint scheme is used (e.g., BF, SF, IF, or TLF), and the rest of the header is encoded as previously described using h−2 bits. In some implementations, UF is excluded from t due to its similarity with SF. In doing so, two, instead of three, bits are used to encode t to reduce the overhead.

The following example heuristics are proposed for selecting a fingerprint scheme for a column block in this specification.

For example, if large variance in data distribution per block is observed, HF can be selected. In some implementations, HF may not offer the best pruning ability. However, HF can provide competitive performance comparing to other fingerprint schemes, and robust performance in different per block data distributions.

In some implementations, if all values close to the extremities of the range (i.e., close to 0 or D−1) are clustered in some blocks, either UF or SF can be selected for the column block, since both offer finer representation for the blocks where those values are absent. If accurate range boundary (e.g., when b is small or when there are not many gaps in the block) is desired, UF can be selected. Otherwise, SF can be selected, since there are more bits for finer fingerprint representation with smaller bin size.

Figure 5:
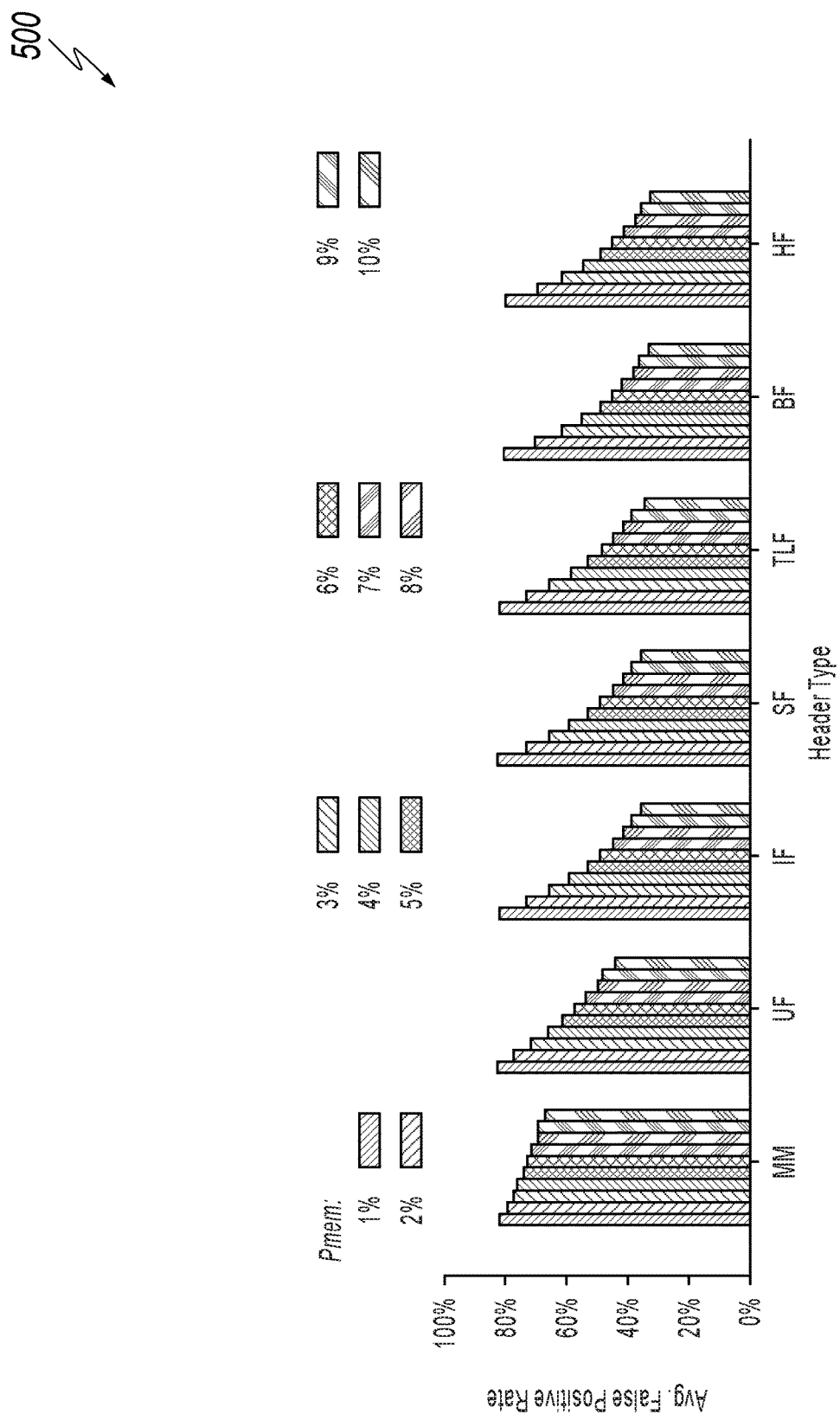
FIG. 5 is a chart showing example experimental results for compressed columnar data search using fingerprints, according to an implementation.

In some implementations, if very large gaps of data are expected in blocks, either TLF or IF can be selected. Selecting between TLF and IF is a tradeoff between performance and pruning ability. For example, the experimental results in FIG. 5 shows that TLF can prune at most 2% of a column more than IF at $p_{mem}=10\%$. However, TLF is more expensive to encode and evaluate than IF due to iterative construction of the fingerprints of the second level.

In some implementations, if the expected pruning ability for all schemes are the same, BF can be selected due to single predicate encoding. In addition, the predicate evaluation over BF can be vectorized to achieve better performance than other fingerprint schemes.

To implement block and predicate encoding for different fingerprint schemes, the following example algorithms are proposed to establish a bijective relation between ranges in a well-ordered integer domain and fingerprint bins. For simplicity, in the following complexity analyses, the hardware is assumed to allow bit shifting to be done in O(1) time.

In some implementations, fingerprint encoding is to divide a well-ordered integer domain into f bins of equal size (e.g., Integer Range to Fingerprint Bits Bijection). In addition, it is assumed that f≠0. Since bins are not always equal size, a convention is established for selecting which bins are greater in size. Without loss of generality, size of bins with the smallest identifiers is increased by one.

Value to Fingerprint Bit Index Algorithm

Length of integer domain $[x_1, x_n]$, $x_1 \leq x_n$, is calculated for which a fingerprint is to be generated. If n=1, only one number is in the integer domain, and is associated with the first bit. Otherwise, to encode $x_i \in [x_1, x_n]$, the associated fingerprint bit index is calculated as $x_i$'s offset in the range divided by the fingerprint bin size. For example, the range length n is divided by the number of fingerprint bits f to find the quotient q and the remainder r. If r=0, all bins have size q, and the fingerprint bit index can be calculated as $$\left\lfloor \frac{x_i - x_1}{q} \right\rfloor.$$

If r≠0, the integer domain is virtually split into two ranges $[x_1, c]$ and $[c+1, x_n]$, where the first range is represented with r fingerprint bits with bin size q+1 and the second range is represented with f−r fingerprint bits with bin size q. If $x_i \leq c$, the fingerprint bit index is $$\left\lfloor \frac{x_i - x_1}{q+1} \right\rfloor.$$

Otherwise, $x_i$ belongs to a fingerprint bit with bin size q, and the associated fingerprint can be calculated with $$\left\lfloor \frac{x_i - x_1 - r}{q} \right\rfloor.$$

One example pseudocode is listed below.

```
GetBitIndex(xi, x1, xn, f):
    n := xn − x1 + 1
    q := floor(n/f)
    r := n mod f
    c := x1 + (q + 1) * r − 1
    if xi <= c then:
        return floor((xi − x1)/(q + 1))
    return floor((xi − x1 − r)/q)
```

In the above example pseudocode, the function has O(1) time complexity.

In the example in FIG. 1, the fingerprint range domain is [0, 4] and five bits are used to create a basic fingerprint. To determine the fingerprint bit for the ueId 2, n=5, q=1, and r=0 are calculated. Since r=0, all bins are of size one, and $$\left\lfloor \frac{2-0}{1} \right\rfloor$$

indicates the fingerprint bit index is 2. If four bits are used, n=5, q=1, r=1 are calculated. Since r≠0, c=0+2×1−1=1. Since 2>1, the fingerprint bit index is $$\left\lfloor \frac{2-0-1}{1} \right\rfloor - 1.$$

Fingerprint Bit Index to Value Range Algorithm

To obtain the value range of a fingerprint bit index i, $0 \leq i < f$, length of integer domain $[x_1, x_n]$, $x_1 \leq x_n$, is calculated for which a fingerprint is to be generated. For example, the range length n is divided by the number of fingerprint bits f to obtain the quotient q and remainder r. If r=0, $[x_1, x_n]$ is divided evenly into f fingerprint bits of bin size q. The range of a fingerprint bit i is $[x_1+i\times q, x_1+(i+1)\times q-1]$. If r≠0, the integer domain is split into two $[x_1, x_1+r\times(q+1)-1]$ and $[x_1+r\times(q+1), x_n]$. The first range is divided evenly into the first r fingerprint bits of bin size q+1, and the second range is divided evenly in the remaining f−r fingerprint bits of bin size q. In some implementations, if i<r, fingerprint bit belongs to the first interval and is associated with the value range $[x_1+i\times(q+1), x_1+(i+1)\times(q+1)-1]$. Otherwise, if i≥r, fingerprint bit is associated with the value range $[x_1+r+i\times q, x_1+r+(i+1)\times q-1]$. One example pseudocode is listed below.

```
GetBitRange(i, x1, xn, f)
    n := xn − x1 + 1
    q := floor(n/f)
    r := n mod f
    if i < r then:
        start := x1 + i * (q + 1)
        end := start + q
    else:
        start := x1 + r + i * q
        end := start + q − 1
    return (start, end)
```

In the above example pseudocode, time complexity of the function is constant with respect to the input size. Therefore, the function has O(1) time complexity.

The example in FIG. 1 has fingerprint domain [0, 4] and uses five bits to encode a basic fingerprint. To retrieve the range of bit index 1, n=5, q=1, and r=0 are determined. Since r=0, the range is [0+1×1, 0+2×1−1] which can be simplified to [1, 1]. If four bits are used, n=5, q=1, and r=1 are calculated. Since r≠0 and 1≥r, the range is [0+1+1×1, 0+1+2×1−1], which can be simplified to [2, 2].

Turning to the algorithms used to encode a block into different fingerprint schemes, it can be shown that all fingerprint block schemes have O(B) encoding time except for HF, which has O(B+h) time complexity.

General Fingerprint Block Encoding Algorithm

This example algorithm iterates over all values in a block, and sets all bits to one in the fingerprint associated with a value. One example pseudocode is listed below.

```
EncodeBlockFingerprint(block, x1, xn, f):
    fingerprint := 0
    for num in block do:
        i = GetBitIndex(num, x1, xn, f)
        fingerprint := fingerprint with bit i set to 1
    return fingerprint
```

In the above example pseudocode, the function iterates through the block (e.g., O(B) iterations). For each value, O(1) operations are performed. Therefore, the function has O(B) time complexity.

For example, to encode the first block from the example in FIG. 1 with five bits and a range domain of [0, 4], a fingerprint with all bits is set to zero (e.g., 00000) first. The values of the block after dictionary compression are {2, 2, 2, 2, 0}. The corresponding fingerprint bit index of each ValueId is determined one by one. When encoding the ValueId 2, the bit of fingerprint index two is set to one (e.g., 00100). In some implementations, encoding a ValueId more than once does not affect the output. When encoding ValueId 0, the fingerprint index zero is set to one (e.g., 10100).

Basic Fingerprint Block Encoding Algorithm

To construct the basic fingerprint, a fingerprint block is encoded with the entire dictionary domain [0,D−1]. One example pseudocode is listed below.

```
EncodeBF(blockData):
    return EncodeBlockFingerprint(blockData, 0, D − 1, f)
```

In the above example pseudocode, the encoding function is a single pass algorithm with O(B) time complexity, therefore it too has O(B) time complexity For example, to encode a block with ValueId set 5, 5, 5, 5, 17, 17, 17, 17, 16, 16, 16, 16 from a column dictionary with range [0, 31] using 16 bits, a fingerprint with all bits is set to zero first. The corresponding fingerprint bit index is determined one by one. For example, the ValueId 5 is associated with fingerprint bit index two, and the bit is set to one (e.g., 0010000000000000). The ValueId 16 and 17 belong to the fingerprint bin index eight, and the bit is set to one also. The final basic fingerprint encoding is 0010000010000000.

Unilateral Fingerprint Block Encoding Algorithm $l_{min}$ and $l_{max}$, local minimum and local maximum of a block respectively, are determined. Length of $[0,l_{max}]$ and length of $[l_{min},D-1]$ are calculated. In some implementations, to minimize fingerprint bit bin size, the range is stored and approximated with a smallest length possible. If both ranges are of the same length, $[l_{min},D-1]$ can be chosen. The indicator bit ind is set to zero if approximating $[l_{min},D-1]$ as $$\left[D-1-\left(2\times\left\lfloor\frac{D-1-l_{min}}{2}\right\rfloor+1\right), D-1\right].$$

ind is set to one if approximating $[0,l_{max}]$ as $$\left[0, 2\times\left\lfloor\frac{l_{max}}{2}\right\rfloor+1\right].$$

The rest of the fingerprint can be encoded using h–b bits. One example pseudocode is listed below.

```
EncodeUF(blockData):
    lmin, lmax := GetMinMax(blockData)
    if lmin > = D - 1 - lmax then:
        lmax := D - 1
        ind := 0
        r := floor((lmax - lmin)/ 2)
        lmin := D - 1 - (2 * r + 1)
    else:
        lmin := 0
        ind := 1
        r := floor((lmax - lmin)/ 2)
        lmax := 2 * r + 1
    fingerprint := EncodeBlockFingerprint(blockData, lmin, lmax, f)
    return header with ind, r, and fingerprint
```

In the above example pseudocode, finding the local minimum and maximum of a block is at worst O(B) time complexity by keeping track of the smallest and biggest integer while iterating through the block. Approximating the range interval is through basic operations that have O(1) time complexity. The function calls a function with O(B) time complexity to create a fingerprint. Therefore, the function has O(B) time complexity.

For example, to encode a block with ValueId set 5, 5, 5, 5, 17, 17, 17, 17, 16, 16, 16, 16 from a column dictionary with range [0, 31] using 16 bits, the local minimum and maximum of the block are determined to be 5 and 17, respectively. Since 5<31–17, ind is set to one, and $$r=\left\lfloor\frac{17-0}{2}\right\rfloor=8$$

is encoded with b–1=4 bits. The rest of the fingerprint is encoded with the domain [0, 17] using the remaining 11 bits. The resulting UF for the block is 1100000100000011.

Selective Fingerprint Block Encoding Algorithm

The interval [0,D–1] can be divided into p partitions. Since equal sized partitions are desired, equal bins are created for p fingerprint bits, using the same function. $l_{min}$ and $l_{max}$, local minimum and local maximum of a block, are determined. The index of a partition containing $l_{min}$ or $l_{max}$, $sel_{min}$ or $sel_{max}$ respectively, is identified. In some implementations, to minimize fingerprint bin size, the selector s that results in the closest approximation is stored. Without loss of generality, $sel_{min}$ is stored to break equalities. If storing $sel_{min}$, ind is set to zero, and the block's fingerprint is encoded using partition $sel_{min}$'s range lower bound as the domain's lower bound. If storing $sel_{max}$, ind is set to one, and the block's fingerprint is encoded using $sel_{max}$'s partition range upper bound as the domain's range upper bound. One example pseudocode is listed below.

```
EncodeSF(blockData):
    lmin, lmax := GetMinMax(blockData)
    min_sel := GetBitIndex(lmin, 0, D - 1, p)
    max_sel := GetBitIndex(lmax, 0, D - 1, p)
    if min_sel >= (p - 1) - max_sel then:
        ind := 0
        s := min_sel
        lmin := GetBitRange(min_sel, 0, D - 1, p) [0]
        lmax := D - 1
    else:
        ind := 1
        s := max_sel
        lmin :=0
        lmax := GetBitRange(max_sel, 0, D - 1, p) [1]
    fingerprint := EncodeBlockFingerprint(blockData, lmin, lmax, f)
    return header with ind, s, and fingerprint
```

In the above example pseudocode, it takes O(B) time to find a local minimum and a local maximum by maintaining the smallest and biggest integer while iterating through a block. Range interval approximation is done by calling helper functions with O(1) time complexity. Fingerprint creation is done by calling a function with O(B) time complexity. Therefore, the function has O(B) time complexity.

For example, to encode a block with ValueId set 5, 5, 5, 5, 17, 17, 17, 17, 16, 16, 16, 16 from a column dictionary with range [0, 31], and to encode a SF for the block with h=16 bits and p=8 partitions, $sel_{min}$=1 and $sel_{max}$=4 can be determined. Since 1<(8–1)–4, $sel_{max}$ is encoded as the selector. The selected partition is associated with the range [16, 19]. The indicator bit is set to one, and $sel_{max}$ is encode using three bits. The remaining 12 bits in the header can be used to create a fingerprint with a range [0, 19]. The resulting SF fingerprint is 1100001000001100.

Impartial Fingerprint Block Encoding Algorithm

In this algorithm, p bits are first used to encode fingerprint[1], the fingerprint in the first section. The local minimum and maximum of a block and their corresponding index in fingerprint[1] are determined. The lower bound of the fingerprint bin containing $l_{min}$ and the upper bound of the fingerprint bin containing $l_{max}$ are calculated. fingerprint[2], the fingerprint in the second section, is then encoded using the approximated domain range calculated at the previous step. One example pseudocode is listed below.

```
EncodeIF(blockData):
    fingerprint1 := EncodeBlockFingerprint(blockData, 0, D - 1, f1)
    lmin, lmax := GetMinMax(blockData)
    minBit := GetBitIndex(lmin, 0, D - 1, f1)
```

```
    maxBit := GetBitIndex(lmax, 0, D - 1, f1)
    lmin := GetBitRange(minBit, 0, D - 1, f1) [0]
    lmax := GetBitRange(maxBit, 0, D - 1, f1) [1]
    fingerprint2 := EncodeBlockFingerprint(blockData, lmin, lmax, f2)
    return header with fingerprint1 and fingerprint2
```

In the above example pseudocode, encoding the fingerprint in the first section is done by calling a helper function with O(B) time complexity. Finding the local minimum and maximum of a block is at worst O(B) time complexity by keeping track of the smallest and biggest integer while iterating through the block. Encoding the fingerprint in the second section is also done by calling a helper function with O(B) time complexity. Therefore, the function has O(B) time complexity.

For example, to encode a block with ValueId set 5, 5, 5, 5, 17, 17, 17, 17, 16, 16, 16, 16 from a column dictionary with range [0, 31], and to encode an IF for the block with h=16 and $f_1$=4, the algorithm outputs 1010 for the first fingerprint section. The first fingerprint indicates that all numbers in the block are in the range [0, 23]. Therefore, the range and the remaining 12 bits are used to encode the second fingerprint as 001000001000. The IF encoding for the block is 1010001000001000.

Two-Level Fingerprint Block Encoding Algorithm

In this algorithm, a coarse level representation of the block is first created with fingerprint$^1$, the fingerprint of size $f_1$ in the first section of the header. While encoding fingerprint$^1$, a counter k is kept for the number of bits sets to 1 as well as a linked list for each bit in fingerprint$^1$ to store all values in the block that belong to the corresponding fingerprint bin. For each bit j set to 1 in fingerprint$^1$, 0≤j<k, fingerprint$_j^2$, a corresponding fingerprint in the second section of the header, is created using bit j's bin range in fingerprint$^1$ as the domain range interval. One example pseudocode is listed below.

```
EncodeTLF(blockData):
    k := 0
    fingerprint1 := 0
    numsInPartition := array of f1 empty linked list
    for num in blockData do:
        i := GetBitIndex(num, 0, D - 1, f1)
        if fingerprint1 bit i is set to 0 then:
            fingerprint1 := fingerprint1 with bit i set to 1
            k := k + 1
        numsInPartition[i].insert(num)
    fingerprint2 := 0
    j := 0
    for bitIndex := 0 to f1 do:
        if j >= k then:
            break
        if fingerprint1[bitIndex] == 0 then:
            continue
        jmin, jmax := GetBitRange(bitIndex, 0, D - 1, f1)
        fStart, fEnd := GetBitRange(j, 0, f2 - 1, k)
        f2J := fEnd - fStart + 1
        values := numsInPartition[bitIndex]
        fprintJ := EncodeBlockFingerprint(values, jmin, jmax, f2J)
        fingerprint2 := fingerprint2 | (fprintJ << fStart)
        j := j + 1
    return header with fingerprint1 and fingerprint2
```

In the above example pseudocode, constructing fingerprint$^1$ and the array of linked list takes O(B) time because iterating through all block values while inserting (or prepending) values into linked lists is O(1) time. When creating the fingerprints in the second section, a for-loop of length $f_1$ can be used. Each fingerprint encoding in the second section of the header takes O(|numsInPartition[i]|), where i is the index of the for-loop. The time complexity of the for-loop is O($\Sigma_{i=0}^{f_1-1}$|numsInPartition[i]|), which can be simplified to O(B). Therefore, the algorithm to encode a TLF has O(B) time complexity.

For example, to encode a block with ValueId set 5, 5, 5, 5, 17, 17, 17, 17, 16, 16, 16, 16 from a column dictionary with range [0, 31], and to encode an TLF for the block with h=16 and $f_1$=4, the algorithm outputs 1010 for the first fingerprint section and two non-empty linked list. The linked list for the first partition contains 5, 5, 5, 5 while the linked list for the third partition contains the remaining ValueId. Since there are two bits set in the first section (k=2), the bits in the second section are divided into two. fingerprint$_0^2$ is encode using 6 bits for the range [0, 7] for all the values in the first partition's linked list: 000100. fingerprint$_1^2$ is then encoded using 6 bits for the range [16, 23] for the values in the third partition's linked list: 100000. The TLF for the block is 1010000100100000.

Heterogeneous Fingerprint Block Encoding Algorithm

In HF, a block is encoded using a fingerprint scheme that has the best pruning ability amongst BF, SF, IF, and TLF. For example, a header is encoded using each fingerprint scheme. Then, the headers are ranked based on two criteria. The primary factor is |ℑ|, the cardinality of the set of values that cannot be pruned during predicate evaluation. A header has a better pruning ability than another header if the associated |ℑ| is smaller. If two FHs have equal |ℑ|, then the number of gaps g are compared. In a fingerprint, g is the number of maximum runs of zeros. Given the same |ℑ|, a fingerprint with a smaller g is ranked higher than another fingerprint with a larger g because it has on average longer runs of zero bits. If two headers have equal |ℑ| and g, the fingerprint is ranked based on the complexity of the encoding evaluation. For example, BF, SF, IF and TLF are ranked in the order from the simplest to the most complex. After ranking all the fingerprints, the best fingerprint (e.g., rank 1) and an index t are encoded to indicate the type of fingerprint that has been encoded. One example pseudocode is listed below.

```
EncodeHF(blockData):
    headers := array of fingerprint headers for blockData
    rankedHeaders := headers ranked from best to worst
    t := rankedHeaders.index(1)
    return header with t and headers[t]
```

In the above example pseudocode, fingerprint encoding for each scheme takes O(B) time. To calculate |ℑ| and g, each bit of the headers created is checked, which has O(h) time complexity. Since the number of headers is fixed, ranking the fingerprints is O(1). Therefore, encoding the heterogeneous fingerprint has O(h+B) time complexity. If h≤B, the encoding time complexity can be simplified to O(B) as in other fingerprint schemes.

For example, to encode a block with ValueId set 5, 5, 5, 5, 17, 17, 17, 17, 16, 16, 16, 16 from a column dictionary with range [0, 31], and to encode an HF for the block with h=18, BF, SF, IF, and TLF are encoded using h−2=16 bits. In addition, $f_1$=4 and p=8. As shown in the previous examples, the encodings are 0010000010000000, 1100001000001100, 1010001000001000, and 1010000100100000, respectively. The |ℑ| value is four for all schemes except TLF for which |ℑ|=3. Since TLF has the lowest |ℑ| value, TLF has the best header. The number of gaps g=3 for all FHs, which does not help break equality in |ℑ| values. Therefore, complexity of the scheme is used to rank the headers. For example, the headers ranked from best to worst for the block is TLF, BF, SF, and IF. t=3 and TLF's fingerprint are used to encode the HF for the block. The final encoding for HF is 111010000100100000.

In some implementations, query predicate(s) is first evaluated on the column dictionary to determine which ValueId answers a query. For example, point and/or range queries are evaluated on the dictionary-compressed column to retrieve the rows with a ValueId belonging to the result set. It is possible to encode individual point and/or range query with FHs in O(1) time complexity. To combine different fingerprint predicate encoding that has the same fingerprint domain and same number of fingerprint bits f, a logical OR operation can be performed.

For example, a point query in a fingerprint domain $[x_1, x_n]$ for a value $v \Sigma [x_1, x_n]$ can be encoded by calling the function GetBitIndex(v, x1, xn, f). The bit index returned can be set to one in a fingerprint, and all other bits remain zero. This takes O(1) time because only elementary operations are used and the time complexity is unaffected by the encoded values.

Range Predicate Encoding Algorithm

For example, to encode a range query for all values v that satisfy rangeFrom≤v<rangeTo into a fingerprint of domain $[x_1, x_n], x_1 \le x_n$, the same function can be used by setting either rangeFrom=$x_1$ or rangeTo=$x_n$+1 if the range query is one sided range query. If rangeFrom≤$x_1$, the query is implied to find all values v that satisfy $x_1$≤v<rangeTo. Likewise, if rangeTo≥$x_n$, the query is implied to find all values that satisfy rangeFrom≤v<$x_n$. This is semantically correct because no values in the block are outside of the range $[x_1, x_n]$. The fingerprint bits for rangeFrom and rangeTo−1 are determined because the two bits and all fingerprint bits in between are set to one. runLength, the number of consecutive bits that will be set to one, is calculated. All bits can be set by performing a fixed number of bitwise operations. One example pseudocode is listed below.

```
EncodeRangeFingerprint(rangeFrom, rangeTo, x1, xn, f):
    if rangeFrom > x1 then:
        fromBit := GetBitIndex(rangeFrom, x1, xn, f)
    else:
        fromBit := 0
    if rangeTo - 1 < xn then:
        toBit := GetBitIndex(rangeTo - 1, x1, xn, f)
    else:
        toBit := f - 1
    runLength := toBit - fromBit + 1
    return ((1 << runLength) - 1) << toBit + runLength
```

In the above example pseudocode, the appropriate bit indices are found by calling helper functions that has O(1) time complexity. Operations in the function are elementary and the function's time complexity will not change with input size. Therefore, the function has O(1) time complexity.

For example, to encode the range query for all ValueId that satisfy 9≤ValueId<13 in a column dictionary with range [0, 31] for a BF that uses 16 bits, rangeFrom=9 is associated to fingerprint bit index four and rangeTo−1=12 is associated to fingerprint bit index eight. The predicate's fingerprint encoding has all bits, from bit index four to eight, set to one. The runLength is five, and $2^5-1$ is bit shifted into the right position to finish encoding the predicate: 0000111110000000.

The following example algorithms are proposed for searching blocks (e.g., 220 in FIG. 2). For example, a query is received to query count, 0≤count≤N, consecutive row(s) from a column starting at row index rowIndex, 0≤rowIndex<N.

Blocks to Scan Determination Algorithm

First, the block that contains rowIndex is identified. Fingerprint block header is evaluated with the predicate. If the block cannot be pruned, the block index is added to a linked list. This process is repeated until all blocks that contain queried rows have been checked. The linked list is returned with all the indices of blocks in an ascending order with values to be decompressed and scanned (e.g., all blocks that cannot be pruned). One example pseudocode is listed below.

```
GetBlocksToScan(headers, rowIndex, count, predicate):
    blocksToScan := [ ]
    blockI := floor(rowIndex / B)
    while blockI * B < rowIndex + count do:
        if headers[blockI] cannot prune predicate then:
            blocksToScan.add(blockI)
        blockI := blockI + 1
    return blocksToScan
```

In the above example pseudocode, the worst-case runtime occurs when the entire column is scanned (e.g., query count=N rows starting at rowIndex=0). In the while-loop, predicates with headers are pruned with at worst $O(f_1)$ time complexity. The number of iterations is equal to the number of blocks. Since fixed sized blocks B are used, the time complexity of the loop is $$O\left(\left\lceil \frac{N}{B} \right\rceil f_1\right) \in O\left(\frac{N}{B} f_1\right).$$

Therefore, the function has $$O\left(\frac{N}{B} f_1\right)$$

time complexity.

In the example in FIG. 1, a query is run for the full column (i.e., rowIndex=0 and count=N). The while-loop iterates through block indices 0, 1, 2, and 3. Since block index 0 and 1 cannot be pruned, they are added to the linked list to be returned.

Scan Pruning Algorithm

Once blocks that cannot be pruned are determined, each block index is converted into a 2-tuple composed of a row index (startIndex) and the number of consecutive rows to scan (blockCount) from that index. If the query starts at a rowIndex that does not align with the start of a block, startIndex can be adjusted to be rowIndex instead of the start of the block. Likewise, if the last row to query does not align with the end of a block, blockCount can be adjusted to the appropriate number. If consecutive blocks are scanned, instead of returning each block's startIndex and blockCount, the startIndex of the first block is returned with the sum of the blockCount. For example, a stack of (startIndex, blockCount) pairs can be returned. One example pseudocode is listed below.

```
GetIndexCountAfterBlockPruning(headers, rowIndex, count, pred):
    blocksToScan := GetBlocksToScan(headers, rowIndex, count, pred)
    ret := [ ]
    lastSearchIndex := rowIndex + count - 1
    prevIndex := -2
```

```
for blockIndex in blocksToScan do:
    if rowIndex > blockIndex * B then:
        startIndex := rowIndex
    else:
        startIndex := blockIndex * B
    blockCount := (blockIndex +1) * B - startIndex
    if startIndex + blockCount > lastSearchIndex then:
        blockCount := lastSearchIndex - startIndex + 1
    if prevIndex + 1 == blockIndex then:
        prevIndex, prevBlockCount := ret.pop( )
        ret.push((prevIndex, prevBlockCount + blockCount))
    else:
        ret.push((startIndex, blockCount))
    prevIndex := blockIndex
return ret
```

In the above example pseudocode, the function call to GetBlocksToScan is an operation with O(N) time complexity, and returns a linked list of O(N) size. Therefore, the number of iterations is O(N) for the loop, and each iteration performs elementary computations. Therefore, the runtime complexity of the function is O(N).

For example, if the query from the example in FIG. 1 is run on the whole column, GetBlocksToScan will return block indices 0 and 1. For block index 0, the startIndex is 0 and blockCount is 5. The tuple (0, 5) is pushed in the stack. For block index 1, the startIndex is 5 and blockCount is 5. Since the block index 0 and block index 1 are successive, the tuple (0, 5) is popped off the stack, and the previous tuple's blockCount is summed up with the current block's blockCount. The resulting tuple (0, 10) is pushed in the stack. The stack is returned when the loop ends.

To determine whether a block can be pruned, the predicate can be evaluated with the fingerprint block header. The following example algorithms are proposed for evaluating predicates with various fingerprint block header schemes.

Basic Fingerprint Evaluation Algorithm

Each query predicate can be encoded as a fingerprint. A bitwise AND operation can be performed to determine whether a block can be pruned. For example, if a resulting bit vector from the bitwise AND operation does not have any bit set to one, the query predicate is disjoint with values in the block, and the block can be pruned. One example pseudocode is listed below.

```
PruneBlockBF(header, predicate):
    pred := predicate fingerprint encoding with [0, D - 1]
    if header & pred == 0 then:
        return true
    return false
```

In the above example pseudocode, predicate fingerprint encoding has O(1) time complexity, and bitwise operations also have O(1) time complexity. Therefore, the function has O(1) time complexity.

For example, a column dictionary range is [0, 31] and BF is used for FHs of 16 bits. To query all ValueId such that ValueId=2√9≤ValueId<13, the predicate is encoded as 0100111000000000. To evaluate the predicate against a header encoding of 0010000010000000, a logical AND operation between the two bit vectors results in 0000000000000000. Therefore, the block with that header can be pruned.

Unilateral Fingerprint Evaluation Algorithm

Masks can be used to extract the value of r and the indicator bit ind. The extracted values can be used to calculate approximation of $l_{min}$ and $l_{max}$. The possibility of early termination can be checked using those ranges. For example, if the block cannot be pruned by early termination, predicate fingerprint is encoded using the approximated $l_{min}$ and $l_{max}$. A bitwise AND operation can be performed between the predicate encoding and the FH encoding to check for disjunction. If the two encodings are disjoint, the block can be pruned. One example pseudocode is listed below.

```
PruneBlockUF(header, predicate):
    r := (header >> 1) & rMask
    if header & 1 != 0 then:
        lmin := 0
        lmax := r * 2 + 1
    else:
        lmax := D - 1
        lmin := lmax - (r * 2 + 1)
    if [lmin, lmax] disjoint with predicate then:
        return true
    fingerprint := (header >> b) & fMask
    pred := predicate fingerprint encoding with [lmin, lmax]
    if pred & fingerprint == 0 then:
        return true
    return false
```

In the above example pseudocode, predicate fingerprint encoding has O(1) time complexity, and bitwise operations also have O(1) time complexity. Therefore, the function has O(1) time complexity.

For example, a column dictionary range is [0, 31] and UF is used for FHs of 16 bits. If the header is 1100000100000011, the header can be decoded that the indicator bit is set to one and that r=8. The remaining 11 bits are encoded using [0, 17] as the fingerprint domain. To query every ValueId against the predicate ValueId=2√9≤ValueId<13, a determination is made as to whether the predicate is disjoint with the fingerprint domain. If early termination is not possible, the predicate is encoded using 11 bits and a fingerprint domain of [0, 17]. A logical AND operation between the header fingerprint 00100000011 and the predicate encoding 01001110000 results in 00000000000. Therefore, the block can be pruned.

Selective Fingerprint Evaluation Algorithm

Masks can be used to extract the value of s and the indicator bit ind. The extracted values can be used to calculate either the approximation of $l_{min}$ or $l_{max}$, and to determine the domain used to encode the header. The possibility of early termination is checked using the fingerprint domain range. For example, if the block cannot be pruned by early termination, predicate fingerprint is encoded using the fingerprint domain range. A bitwise AND operation is performed between the predicate encoding and the FH encoding to check for disjunction. For example, if the two encodings are disjoint, the block is pruned. One example pseudocode is listed below.

```
PruneBlockSF(header, predicate):
    sel := (header >> 1) & selMask
    if header & 1 != 0 then :
        lmin := 0
        lmax := GetBitRange(sel, 0, D - 1, p) [1]
    else:
        lmax := D - 1
        lmin := GetBitRange(sel, 0, D - 1, p) [0]
    if [lmin, lmax] disjoint with predicate then:
        return true
    fingerprint := (header >> (1 + log2(p))) & fingerprintMask
    pred := predicate fingerprint encoding with [lmin, lmax]
```

```
if fingerprint & pred == 0 then:
    return true
return false
```

In the above example pseudocode, predicate fingerprint encoding has O(1) time complexity, and bitwise operations also have O(1) time complexity. Therefore, the function has O(1) time complexity.

For example, a column dictionary range is [0, 31] and SF is used for FHs of 16 bits and p=8. If the header is 1100001000001100, the header can be decoded that the indicator bit is set to one and that s=4. The remaining 12 bits are encoded using [0, 19] as the fingerprint domain. To query all ValueId such that ValueId=2∨9≤ValueId<13, a determination is made as to whether the predicate is disjoint with the fingerprint domain. If early terminate is not possible, the predicate is encoded as a fingerprint using 12 bits and [0, 19] as the fingerprint domain. The fingerprint section of the header 001000001100 and the predicate fingerprint encoding 010011100000 are evaluated together with a logical AND operation. The resulting bit vector is 000000000000, which indicates that the block can be pruned.

Impartial Fingerprint Block Pruning Algorithm fingerprint$^1$ can be extracted using a mask. For example, fingerprint$^1$ is probed to extract minBit and maxBit, the first and last bit set to 1, respectively. From the extracted values, approximation of $l_{min}$ and $l_{max}$ are calculated to encode fingerprint$^2$. Early termination may be possible if the predicate is disjoint with $[l_{min},l_{max}]$. If not, the predicate is encoded using f bits and $[l_{min},l_{max}]$ as the domain to check for pruning opportunities based on gaps. fingerprint$^2$ is extracted with a mask, and is evaluated against the predicate fingerprint encoding using a bitwise AND operation. One example pseudocode is listed below.

```
PruneBlockIF(header, predicate):
    fingerprint1 := header & fingerprint1Mask
    minBit, maxBit := first and last bit set to 1 in fingerprint1
    lmin := GetBitRange(minBit, 0, D - 1, f1) [0]
    lmax := GetBitRange(maxBit, 0, D - 1, f1) [1]
    if [lmin, lmax] disjoint with predicate then:
        return true
    fingerprint2 := (header >> f1) & fingerprint2Mask
    pred := predicate fingerprint with [lmin, lmax] in f2 bits
    if fingerprint2 & pred == 0 then:
        return true
    return false
```

In the above example pseudocode, fingerprint extraction from the header has O(1) time complexity. Probing fingerprint$^1$ for the first and last set bits has O($f_1$) time complexity. Calculating approximation of $l_{min}$ and $l_{max}$ is done by calling functions with O(1) time complexity. Predicate encoding also has O(1) time complexity. Therefore, the function has O($f_1$) time complexity.

For example, a column dictionary range is [0, 31] and IF is used for FHs of 16 bits and $f_1$=4. If the header is 1010001000001000, fingerprint$^1$ is decoded as 1010. The remaining 12 bits are encoded using [0, 23] as the fingerprint domain. To query all ValueId such that ValueId=2∨9≤ValueId<13, a determination is made as to whether the predicate is disjoint with the fingerprint domain. If early terminate is not possible, the predicate is encoded as a fingerprint using 12 bits and [0, 23] as the fingerprint domain. The second fingerprint section of the header 001000001000 and the predicate fingerprint encoding 010011100000 are evaluated together with a logical AND operation. The resulting bit vector is 000000000000, which indicates that the block can be pruned.

Two-Level Fingerprint Block Pruning Algorithm fingerprint$^1$ is first extracted using a mask, and pred$^1$, the predicate fingerprint encoding, is encoded using p bits and the domain [0,D−1]. Early termination may be possible if the result of a logical AND operation between fingerprint$^1$ and pred$^1$ is 0. If the block cannot be terminated early, k, the number of bits set to 1 in fingerprint$^1$, is counted. For each bit set to 1 in fingerprint$^1$, i, the corresponding domain range [bitMin,bitMax] is calculated. If the predicate is not disjoint with the range, the predicate is encoded as a fingerprint using [bitMin,bitMax] and nBits bits, pred$_i^2$. All pred$_i^2$ are combined to form pred$^2$. pred$^2$ is evaluated with fingerprint$^2$ using a logical AND operation. If the result is 0, the block is pruned. One example pseudocode is listed below.

```
PruneBlockTLF(header, predicate):
    fingerprint1 := header & fingerprint1Mask
    pred1 := predicate fingerprint with 1 [0, D - 1] and f1 bits
    if fingerprint1 & pred1 == 0 then:
        return true
    k := number of bits set to 1 in fingerprint1
    pred2 := 0
    i := 0
    for bitIndex := 0 to f1 do:
        if fingerprint2[bitIndex] is set to 0 then:
            continue
        bitMin, bitMax := GetBitRange(bitIndex, 0, D - 1, f1)
        if predicate is disjoint with [bitMin, bitMax] then:
            i := i + 1
            continue
        pred2StartIdx, pred2EndIdx := GetBitRange(i, 0, f2 - 1, k)
        nBits := pred2EndIdx - pred2StartIdx + 1
        pred2i := predicate fingerprint for [bitMin, bitMax] with
        nBits bits
        pred2 := pred2 | (pred2i << pred2StartIdx)
        i := i + 1
    fingerprint2 := (header >> f1) & fingerprint2Mask
    if fingerprint2 & pred2 == 0 then:
        return true
    return false
```

In the above example pseudocode, counting k has O($f_1$) time complexity. pred$^2$ is constructed in the for-loop, which has at most k iterations. Each iteration of the for-loop has O(1) time complexity, and the for-loop has a runtime complexity of O($f_1$). Every other operation in the function has O(1) time complexity. Therefore, the runtime complexity of the function is O($f_1$).

For example, a column dictionary range is [0, 31] and IF is used for FHs of 16 bits and $f_1$=4. If the header is 1010000100100000, the header's fingerprint$^1$ is decoded as 1010. To query all ValueId such that ValueId=2∨9≤ValueId<13, the predicate is encoded with 4 bits and the domain [0, 31] to provide early pruning possibility. A logical AND operation between the header's fingerprint$^1$ 1010 and the predicate encoding 1100 results in 1000, which indicates that early termination is not possible. fingerprint$^1$ indicates that the remaining 12 bits are split into 2, and that in the header fingerprint$_0^2$ is encoded with 6 bits and the domain [0, 7] while fingerprint$_1^2$ is encoded with 6 bits and the domain [16, 23]. The predicate encoding for [0, 7] using 6 bits is 010000 and the predicate encoding for [16, 23] is 000000. A logical AND operation between the second fingerprint 000100100000 and the predicate encoding 010000000000 results in 000000000000, which indicates that the block can be pruned.

Heterogeneous Fingerprint Block Pruning Algorithm

The header type t and the FH encoding tHeader can be extracted. For example, the appropriate block pruning function t can be used on tHeader. One example pseudocode is listed below.

```
PruneBlockHF(header, predicate):
    t := header & tMask
    tHeader := (header >> 2) & tHeaderMask
    if t == 0 then:
        return PruneBlockBF(tHeader, predicate)
    else if t == 1 then:
        return PruneBlockSF(tHeader, predicate)
    else if t == 2 then:
        return PruneBlockIF(tHeader, predicate)
    else:
        return PruneBlockTLF(tHeader, predicate)
```

In the above example pseudocode, extracting t and tHeader takes O(1) time. The rest of the function is a passthrough to another block pruning function. The worst-case runtime comes from calling PruneBlockIF or PruneBlockTLF, which are both $O(f_1)$. Therefore, the time complexity of the function is also $O(f_1)$.

For example, a column dictionary range is [0, 31] and HF is used for FHs of 18 bits. If the header is 111010000100100000, t=3 indicates that 1010000100100000 is a 16 bit fingerprint encoding with TLF. The evaluation can be proceeded as in the examples described above.

Figure 3:
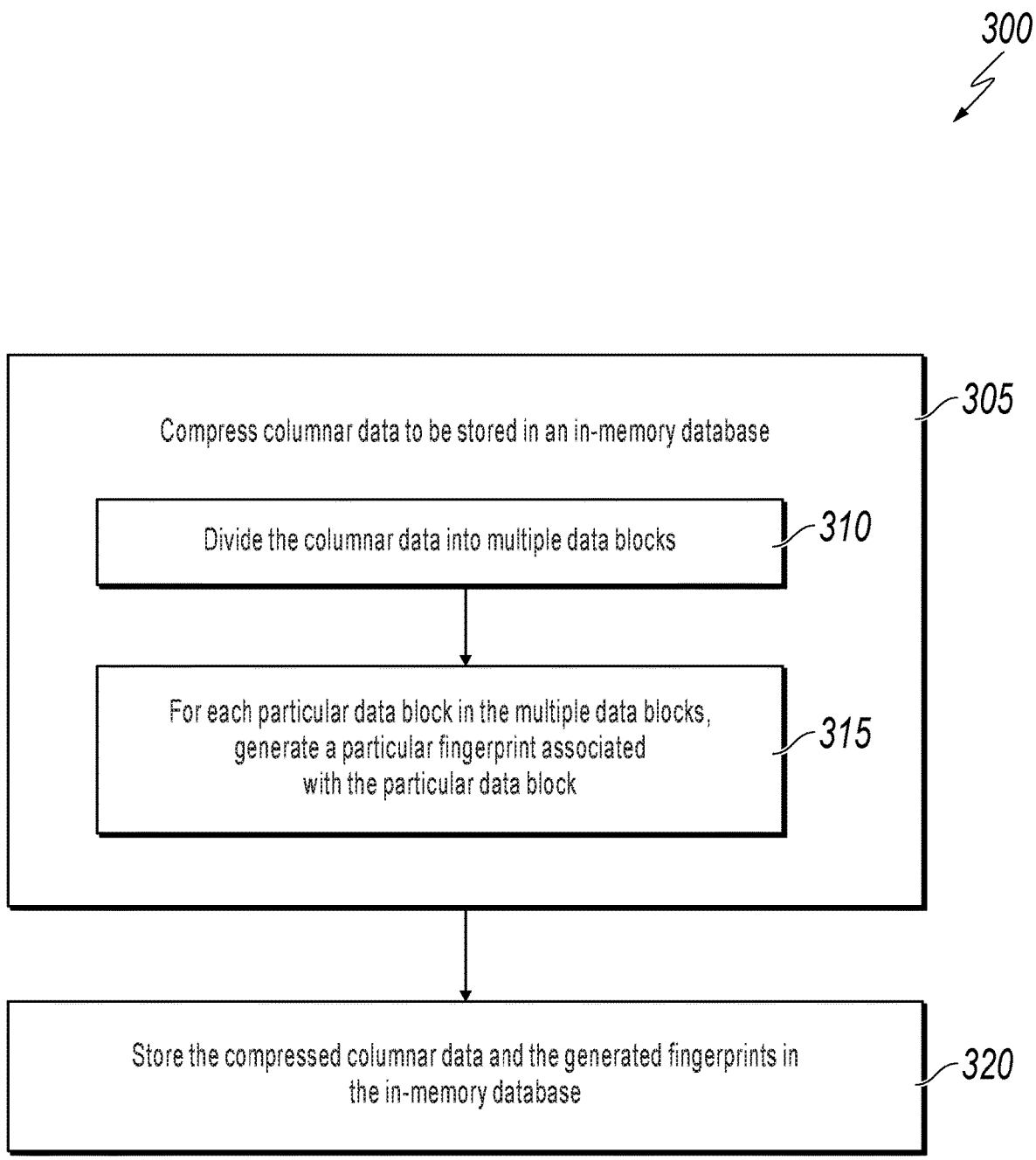
FIG. 3 is a flowchart of an example method for generating fingerprints for compressed columnar data, according to an implementation.

FIG. 3 is a flowchart of an example method 300 for generating fingerprints for compressed columnar data, according to an implementation. It will be understood that method 300 and related methods may be automatically performed, for example, by any suitable system, environment, software, and hardware, or a combination of systems, environments, software, and hardware, as appropriate.

At 305, columnar data is compressed to be stored in an in-memory database. For example, the columnar data is compressed successively using dictionary compression, cluster encoding with a cluster size, and uniform bit packing. In some implementations, the in-memory database is an in-memory columnar database. In some implementations, compressing columnar data can include steps 310 and 315.

At 310, the columnar data is divided into multiple data blocks. The multiple data blocks are fixed size blocks. In some implementations, the multiple data blocks are data blocks with variable size. Blocks provide a finer granularity than partitions. For example, a block contains less data than a partition.

At 315, for each particular data block in the multiple data blocks, a particular fingerprint associated with the particular data block is generated. In some implementations, the particular fingerprint indicates a data range and one or more data gaps of the particular data block. The particular fingerprint can be generated using one of multiple predefined fingerprint schemes based on data distribution in the columnar data. For example, the multiple predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

At 320, the compressed columnar data and the generated fingerprints are stored in the in-memory database. In some implementations, each data block can be encoded based on the particular fingerprint associated with the particular data block.

The example method 300 shown in FIG. 3 can be modified or reconfigured to include additional, fewer, or different actions (not shown in FIG. 3), which can be performed in the order shown or in a different order. For example, after 320, the example method 400 shown in FIG. 4 can be performed. In some implementations, one or more of the actions shown in FIG. 3 can be repeated or iterated, for example, until a terminating condition is reached. In some implementations, one or more of the individual actions shown in FIG. 3 can be executed as multiple separate actions, or one or more subsets of the actions shown in FIG. 3 can be combined and executed as a single action. In some implementations, one or more of the individual actions shown in FIG. 3 may also be omitted from the example method 300.

Figure 4:
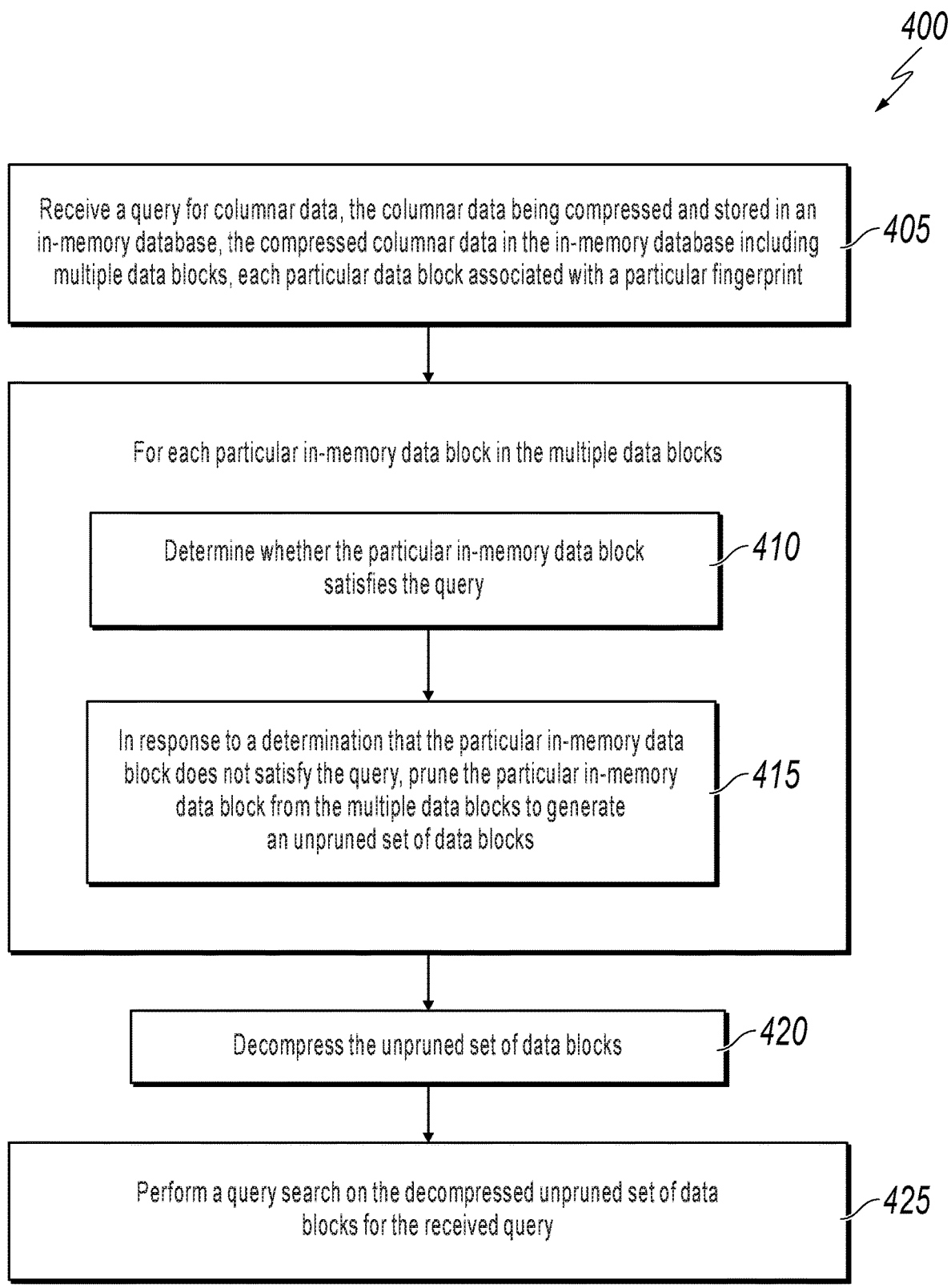
FIG. 4 is a flowchart of an example method for compressed column data search using fingerprints, according to an implementation.

FIG. 4 is a flowchart of an example method 400 for compressed column data search using fingerprints, according to an implementation. It will be understood that method 400 and related methods may be automatically performed, for example, by any suitable system, environment, software, and hardware, or a combination of systems, environments, software, and hardware, as appropriate.

At 405, a query for columnar data is received. In some implementations, the columnar data is compressed and stored in an in-memory database. The compressed columnar data in the in-memory database can include multiple data blocks. Each particular data block is associated with a particular fingerprint. In some implementations, the query includes a query predicate.

In some implementations, the particular fingerprint can indicate a data range and one or more data gaps of the particular data block. The particular fingerprint is generated using one of multiple predefined fingerprint schemes based on data distribution in the columnar data. For example, the multiple predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

For each particular in-memory data block in the multiple data blocks, steps 410 and 415 are automatically performed. At 410, a determination is made as to whether the particular in-memory data block satisfies the query. In some implementations, determining whether the particular in-memory data block satisfies the query includes determining whether the particular in-memory data block satisfies the query predicate. For example, if the query predicate is a range predicate, a fingerprint associated with the particular in-memory data block can be compared to an encoding of the range predicate using a bitwise AND operation to generate a bit vector. If the bit vector has no bit set to 1, the particular in-memory data block does not satisfy the query. If the bit vector has one or more bits set to 1, the particular in-memory data block satisfies the query. In some implementations, the determining is performed on the compressed columnar data and the generated fingerprints stored in the in-memory database.

At 415, in response to a determination that the particular in-memory data block does not satisfy the query, the particular in-memory data block is pruned from the multiple data blocks to generate an unpruned set of data blocks. For example, if a data block does not contain data needed for a query, the data block does not need to be decompressed for a query search. The data block is pruned (e.g., removed) from the multiple data blocks, and the remaining data blocks (e.g., unpruned data blocks) in the multiple data blocks become the unpruned set of data blocks. In some implementations, the pruning is performed on the compressed columnar data and the generated fingerprints stored in the in-memory database. In some implementations, any data block in the unpruned set of data blocks satisfies the query.

At 420, the unpruned set of data blocks, instead of the original multiple data blocks, is decompressed. In some implementations, decompressing the unpruned set of data blocks includes loading the unpruned set of data blocks from a disk storage and/or vectorizing values in the unpruned set of data blocks.

At 425, a query search is performed on the decompressed unpruned set of data blocks for the received query. For example, the query search is not performed on the pruned data blocks, thereby improving performance in the query process.

The example method 400 shown in FIG. 4 can be modified or reconfigured to include additional, fewer, or different actions (not shown in FIG. 4), which can be performed in the order shown or in a different order. For example, the method 400 can be performed following the example method 300 shown in FIG. 3. In some implementations, one or more of the actions shown in FIG. 4 can be repeated or iterated, for example, until a terminating condition is reached. In some implementations, one or more of the individual actions shown in FIG. 4 can be executed as multiple separate actions, or one or more subsets of the actions shown in FIG. 4 can be combined and executed as a single action. In some implementations, one or more of the individual actions shown in FIG. 4 may also be omitted from the example method 400.

Experiments have been conducted to compare the effectiveness of FHs. For example, an experiment is conducted to show the calculation of average maximum fingerprint bin size based on the scheme used and a block's local minimum and maximum values (i.e., Computing Average Maximum Bin Size). Another experiment is conducted to compare pruning ability of fingerprints schemes on TPC-H dataset (i.e., Pruning Ability on TPC-H Dataset).

Computing Average Maximum Bin Size

A fingerprint with minimal bin size has the smallest false positive rate. For example, the dictionary of a synthetic column is $[0, 2^b-1]$. The maximum bin size in a fingerprint for every possible combination of local minimum and maximum value is calculated in a block. $h=2b$, and the header parameters are set to $p=2^{\lfloor \log_2 h \rfloor}$ for SF and $f_1=\lfloor \log_2 h \rfloor$ for IF. TLF and HF are not used in this experiment, because the maximum fingerprint bin size for these two schemes depends not only on the local minimum and maximum but also on the value distribution.

TABLE 3

| b | BF | UF | SF | IF |
|---|---|---|---|---|
| 5 | 4 | 3 | 3 | 3 |
| 6 | 6 | 6 | 4 | 5 |
| 7 | 10 | 9 | 8 | 8 |
| 8 | 16 | 16 | 13 | 12 |
| 9 | 29 | 29 | 21 | 21 |
| 10 | 52 | 52 | 37 | 36 |
| 11 | 94 | 93 | 64 | 64 |
| 12 | 171 | 171 | 115 | 116 |
| 13 | 316 | 315 | 208 | 210 |
| 14 | 586 | 586 | 379 | 384 |
| 15 | 1093 | 1093 | 697 | 710 |
| 16 | 2048 | 2048 | 1300 | 1263 |

TABLE 4

| b | BF | UF | SF | IF |
|---|---|---|---|---|
| 5 | 0 | 1 | 1 | 1 |
| 6 | 0 | 2 | 2 | 2 |
| 7 | 0 | 4 | 3 | 3 |
| 8 | 0 | 7 | 5 | 5 |
| 9 | 0 | 12 | 8 | 9 |
| 10 | 0 | 21 | 14 | 16 |
| 11 | 0 | 38 | 25 | 28 |
| 12 | 0 | 70 | 44 | 49 |
| 13 | 0 | 129 | 80 | 90 |
| 14 | 0 | 239 | 146 | 165 |
| 15 | 0 | 446 | 269 | 305 |
| 16 | 0 | 836 | 515 | 583 |

Table 3 shows the average maximum bin size and Table 4 shows the standard deviation from the average. There is no header that always provides the lowest average maximum bin size. The ideal header depends on the value of b. In addition, the standard deviation differs vastly depending on the type of fingerprint. For example, if a fingerprint scheme has a larger average maximum bin size, the fingerprint scheme may be more effective in practice because a lower standard deviation provides more stable performance. In this experiment, the unweighted average is calculated. An assumption is made that it is equally likely to observe every possible local minimum and maximum. In practice, this assumption may not hold, because within an integer range domain there are more block data distributions having distant local minimum and maximum than block data distributions having close local minimum and maximum. For example, if the column dictionary has the range [0, 7], a block of 20 values is more likely to have the range [2, 6] than [5, 6] if the data is randomly distributed. Since FHs are created for compressed data blocks, data is not randomly distributed in a block. The likelihood of observing a particular $l_{min}$ and $l_{max}$ depends on the block size B. Therefore, the result of this experiment cannot be generalized to predict a fingerprint scheme's performance (as shown in FIG. 5 below). However, the standard deviation offers a general idea of a fingerprint scheme's robustness to a block's local minimum and maximum.

Pruning Ability on TPC-H Dataset

In this experiment, pruning power of Moerkotte's Min-Max (MM) is compared with pruning power of fingerprints with the same space usage. For each method, a fixed block size is set as $$B = \left\lceil \frac{h}{p_{mem} \times b} \right\rceil.$$

Query selectivity, measured by $p_{sel}$ percent of the column dictionary size, is varied. 500 random queries of the same selectivity per column are generated. Columns are chosen from LINEITEM table of TPC-H benchmark (i.e., a standard dataset) with scale factor of 0.1. The header size (h) and the fingerprint size depend on the column size. $h=2b$ is used for all headers. For SF, the number of partitions is $p=2^{\lfloor \log_2 h \rfloor}$. For TLF and IF, $\lfloor \log_2 h \rfloor$ bits are used for the first section.

TABLE 5

| Column Name | b | D |
|---|---|---|
| L_COMMITDATE | 12 | 2,466 |
| L_EXTENDEDPRICE | 17 | 130,792 |

TABLE 5-continued

| Column Name | b | D |
|---|---|---|
| L_ORDERKEY | 18 | 150,000 |
| L_PARTKEY | 15 | 20,000 |
| L_RECEIPTDATE | 12 | 2,547 |
| L_SHIPDATE | 12 | 2,525 |
| L_SUPPKEY | 10 | 1,000 |

Table 5 shows the value of D and b for the TPC-H columns used. Columns are chosen such that D≥100 to have valid queries for $p_{sel}$=1%. As a result, the value of b is restrained to 10≤b≤18 for this experiment.

TABLE 6

| Column Name | MM | BF | UF | SF | IF | TLF | HF |
|---|---|---|---|---|---|---|---|
| L_COMMITDATE | 31 | 70 | 63 | 70 | 68 | 70 | 72 |
| L_EXTENDEDPRICE | 8 | 46 | 30 | 43 | 43 | 43 | 46 |
| L_ORDERKEY | 99 | 96 | 98 | 98 | 98 | 98 | 98 |
| L_PARTKEY | 7 | 44 | 26 | 39 | 39 | 40 | 42 |
| L_RECEIPTDATE | 31 | 65 | 59 | 65 | 64 | 65 | 67 |
| L_SHIPDATE | 31 | 65 | 60 | 65 | 64 | 65 | 67 |
| L_SUPPKEY | 8 | 31 | 16 | 24 | 24 | 24 | 29 |

TABLE 7

| Column Name | MM | BF | UF | SF | IF | TLF | HF |
|---|---|---|---|---|---|---|---|
| L_COMMITDATE | 26.83 | 7.31 | 3.72 | 3.31 | 5.92 | 5.35 | 3.70 |
| L_EXTENDEDPRICE | 16.62 | 12.22 | 5.27 | 4.97 | 11.15 | 11.00 | 9.54 |
| L_ORDERKEY | 0.01 | 1.34 | 0.79 | 0.64 | 0.32 | 0.32 | 0.34 |
| L_PARTKEY | 15.83 | 11.48 | 5.42 | 6.43 | 11.10 | 11.10 | 8.73 |
| L-RECEIPTDATE | 28.13 | 8.37 | 6.03 | 5.62 | 7.18 | 6.83 | 5.57 |
| L_SHIPDATE | 27.81 | 7.86 | 5.50 | 4.93 | 6.74 | 6.45 | 4.95 |
| L_SUPPKEY | 16.26 | 9.20 | 7.92 | 4.61 | 7.20 | 7.20 | 6.77 |

Table 6 shows the average percentage of pruning for $p_{mem}$=10% and $p_{sel}$=1%, with a larger value being more desirable. Table 7 shows the standard deviation of these averages, with a smaller deviation being more desirable. As shown in Table 6 and 7, there is no single fingerprint scheme always outperforms others. The effectiveness depends on data distribution and query selectivity. For example, if a column is sorted and there is no representable gap (e.g., L_ORDERKEY), MM performs better than the proposed fingerprint schemes. However, differences are observed for skewed distributions, and the proposed fingerprint schemes outperform MM for those columns. In particular, difference is noted in column L_PARTKEY where BF skipped 6.29× more data than MM (i.e., 44% pruning vs. 7% in Table 6).

As shown in Table 7, amongst all fingerprint schemes, BF has the greatest standard deviation in average pruning ability, while SF has the smallest standard deviation in average pruning ability. Therefore, SF's performance is the most consistent and least query dependent among all fingerprint schemes. BF provides a good overall average performance, but BF's performance is the most query dependent among all fingerprint schemes.

As shown in Table 7, TLF performs competitively with BF, but sometimes performs below expectation. This can be caused by suboptimal interval partitioning, as well as header to block size ratio. For example, the first section of TLF often does not contain gaps in the corresponding column blocks. Therefore, the second level fingerprints cannot take advantage of more detailed fingerprints that would be constructed in the second stage. In addition, it is difficult to split the second section of TLF into even parts. One extra fingerprint bit may be assigned to some sub-intervals, leading to unequal range length mapping for bits.

FIG. 5 is a chart 500 showing example experimental results for compressed columnar data search using fingerprints, according to an implementation. As illustrated in FIG. 5, the average false positive rates for all columns at $p_{sel}$=1% are presented for different fingerprint schemes with different $p_{mem}$ values. The false positive rate is calculated as the ratio of reported blocks that does not contain any value satisfying a query over the total number of blocks without values satisfying the query. As illustrated, false positive rates are more affected by $p_{mem}$ in the proposed fingerprint schemes than in MM. In MM, false positive rates stay relatively consistent with different $p_{mem}$ values. For example, if $p_{mem}$ is small (i.e., large column block size) and gaps cannot be represented in the column block, false positive rates are almost identical in the proposed fingerprint schemes and MM. For a column block with uniformly distributed value identifiers, using BF, the probability of representing a single gap bit is $$\frac{h-1}{h},$$

which decreases exponentially with increasing block size B. The decay rate is faster for more gap bits, thereby rendering BF ineffective for blocks with uniformly distributed values without gaps.

In this specification, column block fingerprints are introduced as synopsis for predicate pruning on compressed column blocks. Experimental results show potential for superior pruning than MM. In some implementations, practical strategies can be designed to achieve lower false positive rate with less memory consumption. In some implementations, heuristics can be developed for optimal fingerprint selection per column block and/or optimal parameter setting per fingerprint. In some implementations, the techniques described in this specification can be extended beyond one column and/or header-level pruning.

Alternative methods of compressed columnar data search may be used in other implementations. Those described herein are examples and are not meant to be limiting.

Described implementations of the subject matter can include one or more features, alone or in combination.

For example, in a first implementation, a computer-implemented method includes: compressing columnar data to be stored in an in-memory database, including: dividing the columnar data into a plurality of data blocks; and for each particular data block in the plurality of data blocks, generating a particular fingerprint associated with the particular data block; storing the compressed columnar data and the generated fingerprints in the in-memory database; receiving a query for the columnar data; for each particular in-memory data block in the plurality of data blocks stored in the in-memory database: determining whether the particular in-memory data block satisfies the query; and in response to a determination that the particular in-memory data block does not satisfy the query, pruning the particular in-memory data block from the plurality of data blocks to generate an unpruned set of data blocks; decompressing the unpruned set of data blocks; and performing a query search on the decompressed unpruned set of data blocks for the received query.

The foregoing and other described implementations can each optionally include one or more of the following features:

A first feature, combinable with any of the following features, wherein the particular fingerprint indicates a data range and one or more data gaps of the particular data block, and wherein the particular fingerprint is generated using one of a plurality of predefined fingerprint schemes based on data distribution in the columnar data.

A second feature, combinable with any of the previous or following features, wherein the plurality of predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

A third feature, combinable with any of the previous or following features, wherein the query includes a query predicate, and wherein determining whether the particular in-memory data block satisfies the query includes determining whether the particular in-memory data block satisfies the query predicate.

A fourth feature, combinable with any of the previous or following features, wherein the query predicate is a range predicate, and wherein determining whether the particular in-memory data block satisfies the query predicate includes comparing a fingerprint associated with the particular in-memory data block and an encoding of the range predicate using a bitwise AND operation.

A fifth feature, combinable with any of the previous or following features, wherein the determining and pruning are performed on the compressed columnar data and the generated fingerprints stored in the in-memory database.

A sixth feature, combinable with any of the previous or following features, wherein any data block in the unpruned set of data blocks satisfies the query, and wherein decompressing the unpruned set of data blocks includes vectorizing values in the unpruned set of data blocks.

In a second implementation, a non-transitory computer storage medium encoded with a computer program, the program comprising instructions that, when executed by one or more computers, cause the one or more computers to perform operations comprising: compressing columnar data to be stored in an in-memory database, including: dividing the columnar data into a plurality of data blocks; and for each particular data block in the plurality of data blocks, generating a particular fingerprint associated with the particular data block; storing the compressed columnar data and the generated fingerprints in the in-memory database; receiving a query for the columnar data; for each particular in-memory data block in the plurality of data blocks stored in the in-memory database: determining whether the particular in-memory data block satisfies the query; and in response to a determination that the particular in-memory data block does not satisfy the query, pruning the particular in-memory data block from the plurality of data blocks to generate an unpruned set of data blocks; decompressing the unpruned set of data blocks; and performing a query search on the decompressed unpruned set of data blocks for the received query.

The foregoing and other described implementations can each optionally include one or more of the following features:

A first feature, combinable with any of the following features, wherein the particular fingerprint indicates a data range and one or more data gaps of the particular data block, and wherein the particular fingerprint is generated using one of a plurality of predefined fingerprint schemes based on data distribution in the columnar data.

A second feature, combinable with any of the previous or following features, wherein the plurality of predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

A third feature, combinable with any of the previous or following features, wherein the query includes a query predicate, and wherein determining whether the particular in-memory data block satisfies the query includes determining whether the particular in-memory data block satisfies the query predicate.

A fourth feature, combinable with any of the previous or following features, wherein the query predicate is a range predicate, and wherein determining whether the particular in-memory data block satisfies the query predicate includes comparing a fingerprint associated with the particular in-memory data block and an encoding of the range predicate using a bitwise AND operation.

A fifth feature, combinable with any of the previous or following features, wherein the determining and pruning are performed on the compressed columnar data and the generated fingerprints stored in the in-memory database.

A sixth feature, combinable with any of the previous or following features, wherein any data block in the unpruned set of data blocks satisfies the query, and wherein decompressing the unpruned set of data blocks includes vectorizing values in the unpruned set of data blocks.

In some implementations, the computer program product can be implemented on a non-transitory, computer-readable medium storing one or more instructions executable by a computer system to perform the above-described operations.

In a third implementation, a computer-implemented system, comprising: one or more computers; and one or more computer memory devices interoperably coupled with the one or more computers and having tangible, non-transitory, machine-readable media storing one or more instructions that, when executed by the one or more computers, perform one or more operations comprising: compressing columnar data to be stored in an in-memory database, including: dividing the columnar data into a plurality of data blocks; and for each particular data block in the plurality of data blocks, generating a particular fingerprint associated with the particular data block; storing the compressed columnar data and the generated fingerprints in the in-memory database; receiving a query for the columnar data; for each particular in-memory data block in the plurality of data blocks stored in the in-memory database: determining whether the particular in-memory data block satisfies the query; and in response to a determination that the particular in-memory data block does not satisfy the query, pruning the particular in-memory data block from the plurality of data blocks to generate an unpruned set of data blocks; decompressing the unpruned set of data blocks; and performing a query search on the decompressed unpruned set of data blocks for the received query.

The foregoing and other described implementations can each optionally include one or more of the following features:

A first feature, combinable with any of the following features, wherein the particular fingerprint indicates a data range and one or more data gaps of the particular data block, and wherein the particular fingerprint is generated using one of a plurality of predefined fingerprint schemes based on data distribution in the columnar data.

A second feature, combinable with any of the previous or following features, wherein the plurality of predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

A third feature, combinable with any of the previous or following features, wherein the query includes a query predicate, and wherein determining whether the particular in-memory data block satisfies the query includes determining whether the particular in-memory data block satisfies the query predicate.

A fourth feature, combinable with any of the previous or following features, wherein the query predicate is a range predicate, and wherein determining whether the particular in-memory data block satisfies the query predicate includes comparing a fingerprint associated with the particular in-memory data block and an encoding of the range predicate using a bitwise AND operation.

A fifth feature, combinable with any of the previous or following features, wherein the determining and pruning are performed on the compressed columnar data and the generated fingerprints stored in the in-memory database.

A sixth feature, combinable with any of the previous or following features, wherein any data block in the unpruned set of data blocks satisfies the query, and wherein decompressing the unpruned set of data blocks includes vectorizing values in the unpruned set of data blocks.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible, non-transitory, computer-readable computer-storage medium for execution by, or to control the operation of, data processing apparatus. Alternatively or in addition, the program instructions can be encoded on an artificially generated propagated signal, for example, a machine-generated electrical, optical, or electromagnetic signal i.e. generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be, or further include, special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, IOS, or any other suitable conventional operating system.

A computer program, which may also be referred to or described as a program, software, a software application, a module, a software module, a script, or code can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components, as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM), or both. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory, as appropriate) suitable for storing computer program instructions and data include all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and CD-ROM, DVD+/-R, DVD-RAM, and DVD-ROM disks. The memory may store various objects or data, including caches, classes, frameworks, applications, backup data, jobs, web pages, web page templates, database tables, repositories storing dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device i.e. used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with this disclosure), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

In some implementations, any or all of the components of the computing system, both hardware or software (or a combination of hardware and software), may interface with each other or the interface using an application programming interface (API) or a service layer (or a combination of API and service layer). The API may include specifications for routines, data structures, and object classes. The API may be either computer language independent or dependent and refer to a complete interface, a single function, or even a set of APIs. The service layer provides software services to the computing system. The functionality of the various components of the computing system may be accessible for all service consumers using this service layer. Software services provide reusable, defined business functionalities through a defined interface. For example, the interface may be software written in JAVA, C++, or other suitable language providing data in extensible markup language (XML) format or other suitable format. The API or service layer (or a combination of the API and the service layer) may be an integral or a stand-alone component in relation to other components of the computing system. Moreover, any or all parts of the service layer may be implemented as child or sub-modules of another software module, enterprise application, or hardware module without departing from the scope of this disclosure.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although features may be described above as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the implementations described above should not be understood as requiring such separation or integration in all implementations, and it should be understood that the described program components and systems can generally be integrated together in a single software product or packaged into multiple software products.

Accordingly, the above description of example implementations does not define or constrain this disclosure. Other changes, substitutions, and alterations are also possible without departing from the spirit and scope of this disclosure.

Furthermore, any claimed implementation below is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A computer-implemented method, comprising:
   compressing columnar data to be stored in an in-memory database, including:
      dividing the columnar data into a plurality of data blocks; and
      in response to dividing the columnar data into the plurality of data blocks, and for each particular data block in the plurality of data blocks, generating a particular fingerprint associated with the particular data block, wherein the particular fingerprint indicates a data range and one or more data gaps of the particular data block, and wherein the particular fingerprint is generated using one of a plurality of predefined fingerprint schemes based on data distribution in the columnar data;
   storing the compressed columnar data and the generated fingerprints in the in-memory database;
   receiving a query for the columnar data;
   for each particular in-memory data block in the plurality of data blocks stored in the in-memory database:
      determining whether the particular in-memory data block satisfies the query based on the particular fingerprint associated with the particular in-memory data block and on the data range and the one or more data gaps of the particular in-memory data block indicated by the particular fingerprint; and
      in response to a determination that the particular in-memory data block does not satisfy the query, pruning the particular in-memory data block from the plurality of data blocks to generate an unpruned set of data blocks;
   decompressing the unpruned set of data blocks; and
   performing a query search on the decompressed unpruned set of data blocks for the received query.

2. The computer-implemented method of claim 1, wherein the plurality of predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

3. The computer-implemented method of claim 1, wherein the query includes a query predicate, and wherein determining whether the particular in-memory data block satisfies the query includes determining whether the particular in-memory data block satisfies the query predicate.

4. The computer-implemented method of claim 3, wherein the query predicate is a range predicate, and wherein determining whether the particular in-memory data block satisfies the query predicate includes comparing a fingerprint associated with the particular in-memory data block and an encoding of the range predicate using a bitwise AND operation.

5. The computer-implemented method of claim 1, wherein the determining and pruning are performed on the compressed columnar data and the generated fingerprints stored in the in-memory database.

6. The computer-implemented method of claim 1, wherein any data block in the unpruned set of data blocks satisfies the query, and wherein decompressing the unpruned set of data blocks includes vectorizing values in the unpruned set of data blocks.

7. A non-transitory computer storage medium encoded with a computer program, the program comprising instructions that, when executed by one or more computers, cause the one or more computers to perform operations comprising:
   compressing columnar data to be stored in an in-memory database, including:
      dividing the columnar data into a plurality of data blocks; and
      in response to dividing the columnar data into the plurality of data blocks, for each particular data block in the plurality of data blocks, generating a particular fingerprint associated with the particular data block, wherein the particular fingerprint indicates a data range and one or more data gaps of the particular data block, and wherein the particular fingerprint is generated using one of a plurality of predefined fingerprint schemes based on data distribution in the columnar data;
   storing the compressed columnar data and the generated fingerprints in the in-memory database;
   receiving a query for the columnar data;
   for each particular in-memory data block in the plurality of data blocks stored in the in-memory database:
      determining whether the particular in-memory data block satisfies the query based on the particular fingerprint associated with the particular in-memory data block and on the data range and the one or more data gaps of the particular in-memory data block indicated by the particular fingerprint; and
      in response to a determination that the particular in-memory data block does not satisfy the query, pruning the particular in-memory data block from the plurality of data blocks to generate an unpruned set of data blocks;
   decompressing the unpruned set of data blocks; and
   performing a query search on the decompressed unpruned set of data blocks for the received query.

8. The non-transitory computer storage medium of claim 7, wherein the plurality of predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

9. The non-transitory computer storage medium of claim 7, wherein the query includes a query predicate, and wherein determining whether the particular in-memory data block satisfies the query includes determining whether the particular in-memory data block satisfies the query predicate.

10. The non-transitory computer storage medium of claim 9, wherein the query predicate is a range predicate, and wherein determining whether the particular in-memory data block satisfies the query predicate includes comparing a fingerprint associated with the particular in-memory data block and an encoding of the range predicate using a bitwise AND operation.

11. The non-transitory computer storage medium of claim 7, wherein the determining and pruning are performed on the compressed columnar data and the generated fingerprints stored in the in-memory database.

12. The non-transitory computer storage medium of claim 7, wherein any data block in the unpruned set of data blocks satisfies the query, and wherein decompressing the unpruned set of data blocks includes vectorizing values in the unpruned set of data blocks.

13. A computer-implemented system, comprising:
one or more computers; and
one or more computer memory devices interoperably coupled with the one or more computers and having tangible, non-transitory, machine-readable media storing one or more instructions that, when executed by the one or more computers, perform one or more operations comprising:
compressing columnar data to be stored in an in-memory database, including:
dividing the columnar data into a plurality of data blocks; and
in response to dividing the columnar data into the plurality of data blocks, for each particular data block in the plurality of data blocks, generating a particular fingerprint associated with the particular data block, wherein the particular fingerprint indicates a data range and one or more data gaps of the particular data block, and wherein the particular fingerprint is generated using one of a plurality of predefined fingerprint schemes based on data distribution in the columnar data;
storing the compressed columnar data and the generated fingerprints in the in-memory database;
receiving a query for the columnar data;
for each particular in-memory data block in the plurality of data blocks stored in the in-memory database:
determining whether the particular in-memory data block satisfies the query based on the particular fingerprint associated with the particular in-memory data block and on the data range and the one or more data gaps of the particular in-memory data block indicated by the particular fingerprint; and
in response to a determination that the particular in-memory data block does not satisfy the query, pruning the particular in-memory data block from the plurality of data blocks to generate an unpruned set of data blocks;
decompressing the unpruned set of data blocks; and
performing a query search on the decompressed unpruned set of data blocks for the received query.

14. The computer-implemented system of claim 5, wherein the plurality of predefined fingerprint schemes includes at least two of a Basic Fingerprint (BF) scheme, a Unilateral Fingerprint (UF) scheme, a Selective Fingerprint (SF) scheme, a Two-Level Fingerprint (TLF) scheme, an Impartial Fingerprint (IF) scheme, and a Heterogeneous Fingerprint (HF) scheme.

15. The computer-implemented system of claim 13, wherein the query includes a query predicate, and wherein determining whether the particular in-memory data block satisfies the query includes determining whether the particular in-memory data block satisfies the query predicate.

16. The computer-implemented system of claim 15, wherein the query predicate is a range predicate, and wherein determining whether the particular in-memory data block satisfies the query predicate includes comparing a fingerprint associated with the particular in-memory data block and an encoding of the range predicate using a bitwise AND operation.

17. The computer-implemented system of claim 13, wherein the determining and pruning are performed on the compressed columnar data and the generated fingerprints stored in the in-memory database.

\* \* \* \* \*